(12) United States Patent
Kalra et al.

(10) Patent No.: US 9,318,533 B2
(45) Date of Patent: Apr. 19, 2016

(54) METHODS AND SYSTEMS TO REDUCE LOCATION-BASED VARIATIONS IN SWITCHING CHARACTERISTICS OF 3D RERAM ARRAYS

(71) Applicant: SANDISK 3D LLC, Milpitas, CA (US)

(72) Inventors: Pankaj Kalra, Santa Clara, CA (US); Chandrasekhar Gorla, Cupertino, CA (US); Masaaki Higashitani, Cupertino, CA (US)

(73) Assignee: SANDISK 3D LLC, Milpitas, CA (US)

( * ) Notice: Subject to any disclaimer, the term of this patent is extended or adjusted under 35 U.S.C. 154(b) by 0 days.

(21) Appl. No.: 14/462,374

(22) Filed: Aug. 18, 2014

(65) Prior Publication Data
US 2014/0353573 A1   Dec. 4, 2014

Related U.S. Application Data

(60) Provisional application No. 61/873,779, filed on Sep. 4, 2013.

(51) Int. Cl.
*H01L 29/06* (2006.01)
*H01L 27/24* (2006.01)
*H01L 45/00* (2006.01)
(Continued)

(52) U.S. Cl.
CPC ........ *H01L 27/2481* (2013.01); *H01L 27/2409* (2013.01); *H01L 45/04* (2013.01); *H01L 45/146* (2013.01); *H01L 45/16* (2013.01); *H01L 28/20* (2013.01); *H01L 29/78642* (2013.01)

(58) Field of Classification Search
CPC . H01L 27/2409; H01L 27/2481; H01L 45/04; H01L 45/16; H01L 45/146

USPC .............................................................. 257/5
See application file for complete search history.

(56) References Cited

U.S. PATENT DOCUMENTS

2007/0008773 A1* 1/2007 Scheuerlein ........ H01L 45/1675
                                                    365/161
2009/0201710 A1   8/2009 Ueda
(Continued)

FOREIGN PATENT DOCUMENTS

EP          1420408           5/2004
WO     WO2006065523           6/2006

OTHER PUBLICATIONS

Chen, et al., U.S. Appl. No. 13/773,078, filed Feb. 21, 2013.
Siau, et al., U.S. Appl. No. 14/283,034, filed May 20, 2014.
(Continued)

*Primary Examiner* — Matthew Gordon
(74) *Attorney, Agent, or Firm* — Vierra Magen Marcus LLP

(57) ABSTRACT

Methods for reducing location-based variations in the switching characteristics of memory cells within a memory array are described. In some cases, the resistance of an embedded resistor within each memory cell may be set to reduce the overall variation in series resistances for the memory cells within a memory array. For example, embedded resistors associated with far-far bits may be set to a lower resistance than embedded resistors associated with near-near bits. An embedded resistor may comprise a layer of polysilicon within a memory cell. Selective ion implantation may be used to reduce the embedded resistor resistance for memory cells within a particular region of the memory array and to form two or more different sets of embedded resistors within the memory array.

16 Claims, 23 Drawing Sheets

(51) Int. Cl.
*H01L 49/02* (2006.01)
*H01L 29/786* (2006.01)

(56) References Cited

U.S. PATENT DOCUMENTS

2011/0096590 A1    4/2011   Iwata
2011/0266510 A1*  11/2011   Quitoriano ............. B82Y 10/00
                                                           257/2

OTHER PUBLICATIONS

PCT International Search Report dated Nov. 5, 2014, PCT Patent Application No. PCT/US2014/053286.

PCT Written Opinion of the International Searching Report dated Nov. 5, 2014, PCT Patent Application No. PCT/US2014/053286.

* cited by examiner

METHODS AND SYSTEMS TO REDUCE LOCATION-BASED VARIATIONS IN SWITCHING CHARACTERISTICS OF 3D RERAM ARRAYS

CLAIM OF PRIORITY

The present application claims priority to U.S. Provisional Application No. 61/873,779, entitled "Methods to Reduce Location-Based Variations in Switching Characteristics of 3D ReRAM Arrays," filed Sep. 4, 2013, which is herein incorporated by reference in its entirety.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics and increased word line and bit line resistance.

DETAILED DESCRIPTION

Figure 1A:
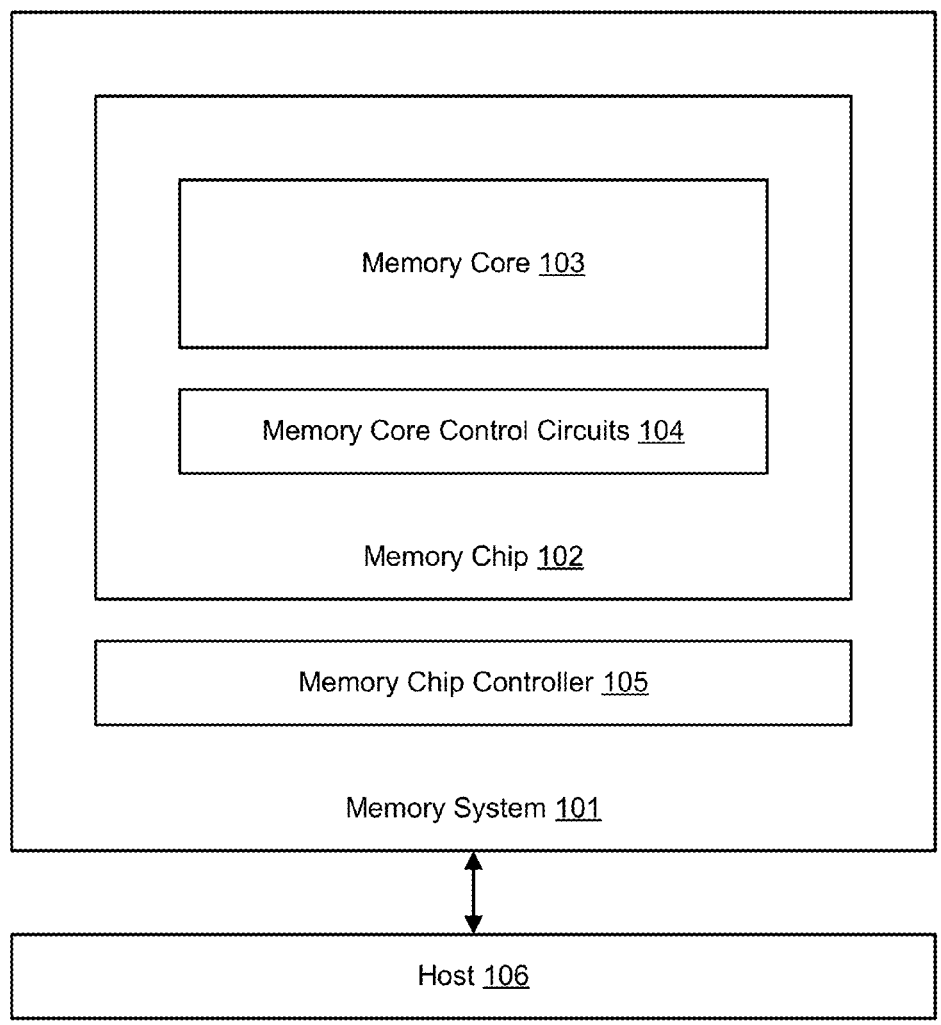
FIG. 1A depicts one embodiment of a memory system and a host.

Technology is described for reducing location-based variations in the switching characteristics of memory cells within a memory array. In some cases, the switching characteristics of a memory cell (e.g., the ability of the memory cell to be set and reset over a number of programming cycles or the ability the memory cell to be reliably programmed and erased for more than a threshold number of program-erase cycles) may depend on the location of the memory cell within a memory array. The location of the memory cell within the memory array may determine the word line resistance and the bit line resistance in series with the memory cell. The series resistance, including the word line resistance and the bit line resistance in series with the memory cell, may affect the switching characteristics of the memory cell. In one example, memory cells with a large series resistance (e.g., memory cells corresponding with far-far bits) may be difficult to program or set due to the large IR drop across the series resistance, while memory cells with a small series resistance (e.g., memory cells corresponding with near-near bits) may be difficult to reset. In another example, memory cells with a large series resistance may have a higher reset yield compared to memory cells with a small series resistance as the large series resistance may prevent the memory cells from being placed into a high on-current state (e.g., into a state where a memory cell may conduct more than 1 mA) from which the memory cells may be unable to be reset.

In some embodiments, the resistance of an embedded resistor within each memory cell may be set to reduce the overall variation in series resistances for the memory cells within a memory array. In one example, embedded resistors associated with far-far bits may be set to a lower resistance than embedded resistors associated with near-near bits. An embedded resistor may comprise a polysilicon resistor whose resistance may be tuned or set based on its location within the memory array. In some cases, selective ion implantation may be used to reduce the embedded resistor resistance for memory cells within a particular region of the memory array (e.g., a region associated with far-far bits). In one embodiment, an embedded resistor may comprise a layer of polysilicon within a memory cell (e.g., a polysilicon layer with a thickness between 15 nm and 45 nm). When the polysilicon layer is deposited, the in-situ doping conditions may be selected such that the resulting resistance of the polysilicon layer allows near-near bits to be reset. After the polysilicon layer has been deposited, selective ion implantation may be used to reduce the resistance of polysilicon layers that are located within a particular region of a memory array. A mask (in some cases, a non-critical mask) may be used to perform a selective ion implantation to only those memory cells that are located within the particular region. The selective ion implantation may be used to dope the polysilicon layers within the particular region in order to reduce their resistance. In this case, the embedded resistors for memory cells within the particular region (e.g., the far-far bits) may comprise in-situ doped and selectively ion implanted polysilicon resistors, while the embedded resistors for memory cells outside the particular region may comprise just in-situ doped polysilicon resistors. Thus, selective ion implantation may allow two or more different sets of embedded resistors to be formed within the memory array.

In one embodiment, a first set of embedded resistors corresponding with near-near bits may be set to a first resistance, a second set of embedded resistors corresponding with middle-middle bits may be set to a second resistance less than the first resistance, and a third set of embedded resistors corresponding with far-far bits may be set to a third resistance less than the second resistance. In some cases, the first resistance, second resistance, and third resistance may be set such that the average series resistance placed in series with the near-near bits, middle-middle bits, and far-far bits is substantially the same. In one example, the average word line and bit line resistance for far-far bits may be around 44K ohms, the average word line and bit line resistance for middle-middle bits may be around 24K ohms, and the average word line and bit line resistance for near-near bits may be around 4K ohms. If the first resistance is set to be 44K ohms, the second resistance is set to be 24K ohms, and the third resistance is set to be 4K ohms, then the average series resistance placed in series with the near-near bits, middle-middle bits, and far-far bits would be equal to 48K ohms. Thus, the series resistance in series with a far-far bit may be tuned to be roughly the same as the series resistance in series with a near-near bit.

One issue regarding the programming of memory cells in a memory array is that the resulting switching characteristics or I-V characteristics of each memory cell may depend on the resistance of the programming path in series with the memory cell. For example, the switching characteristics of a near-near memory cell (i.e., a memory cell with relatively small path resistance due to being located near the bit line biasing circuit and located near the word line biasing circuit) may be different from the switching characteristics of a far-far memory cell (i.e., a memory cell with relatively large path resistance due to being located far from the bit line biasing circuit and located far from the word line biasing circuit). The difference in series resistance may limit the size of the memory array as a series resistance that is too high may make setting far-far memory cells difficult and a series resistance that is too low may make resetting near-near memory cells difficult. Thus, one benefit of forming two or more different sets of embedded resistors within a memory array to reduce the overall variation in series resistances for the memory cells within the memory array is that larger, more area efficient memory arrays may be used, thereby reducing the cost of manufacturing a memory die.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device). In some cases, the memory system 101 may be embedded within the host 106. In other cases, the memory system 101 may comprise a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit. In other embodiments, memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
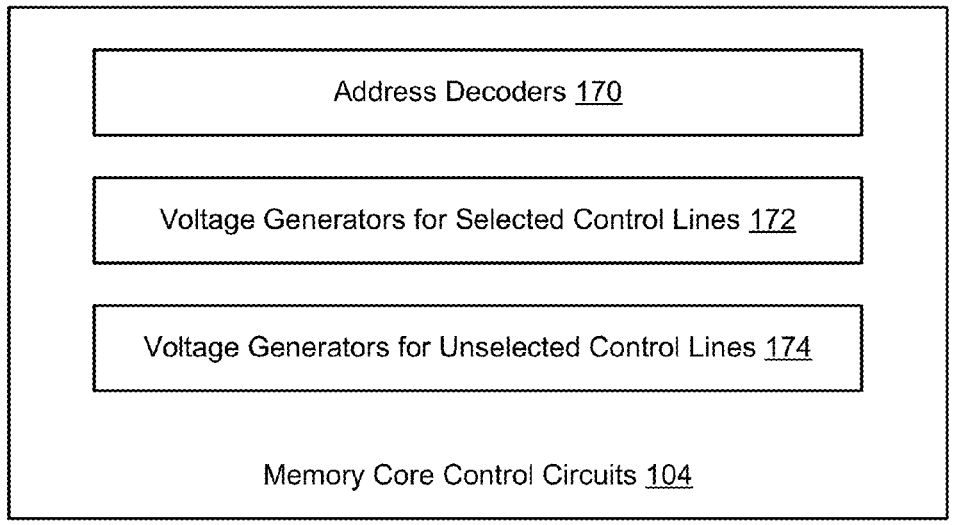
FIG. 1B depicts one embodiment of memory core control circuits.

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
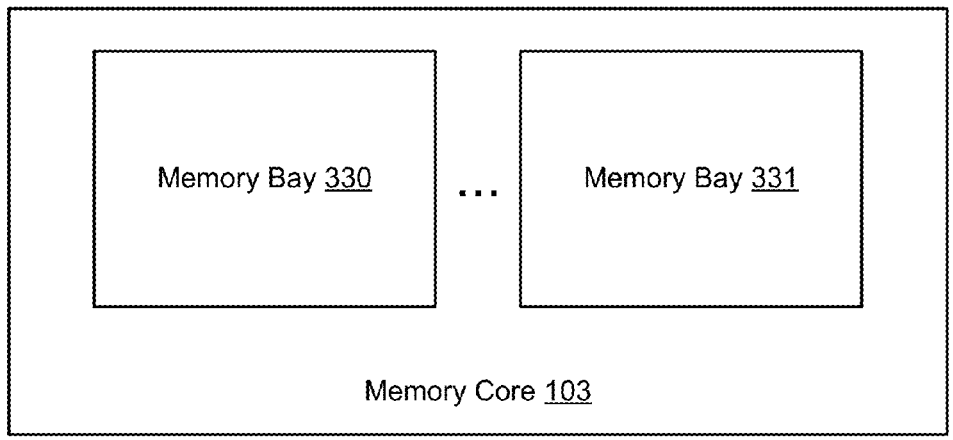
FIG. 1C depicts one embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
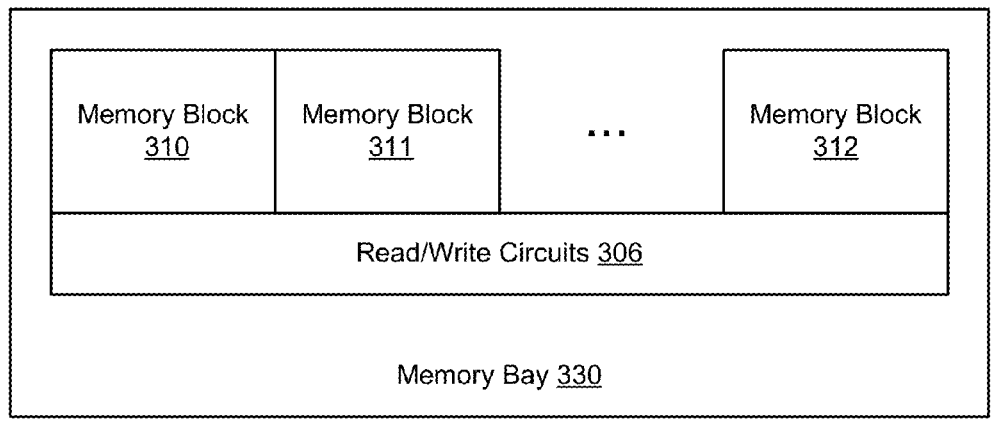
FIG. 1D depicts one embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
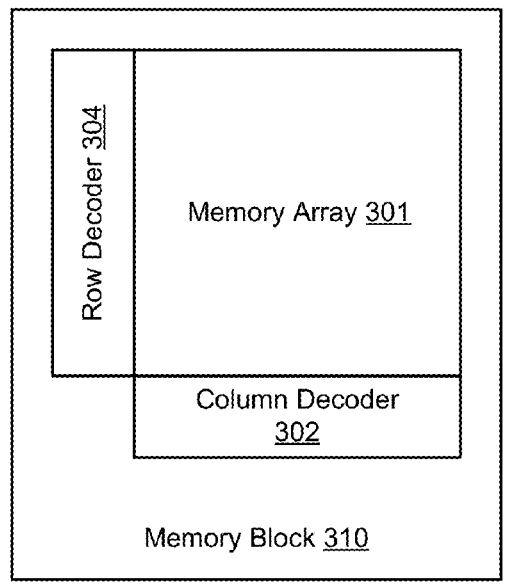
FIG. 1E depicts one embodiment of a memory block.

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
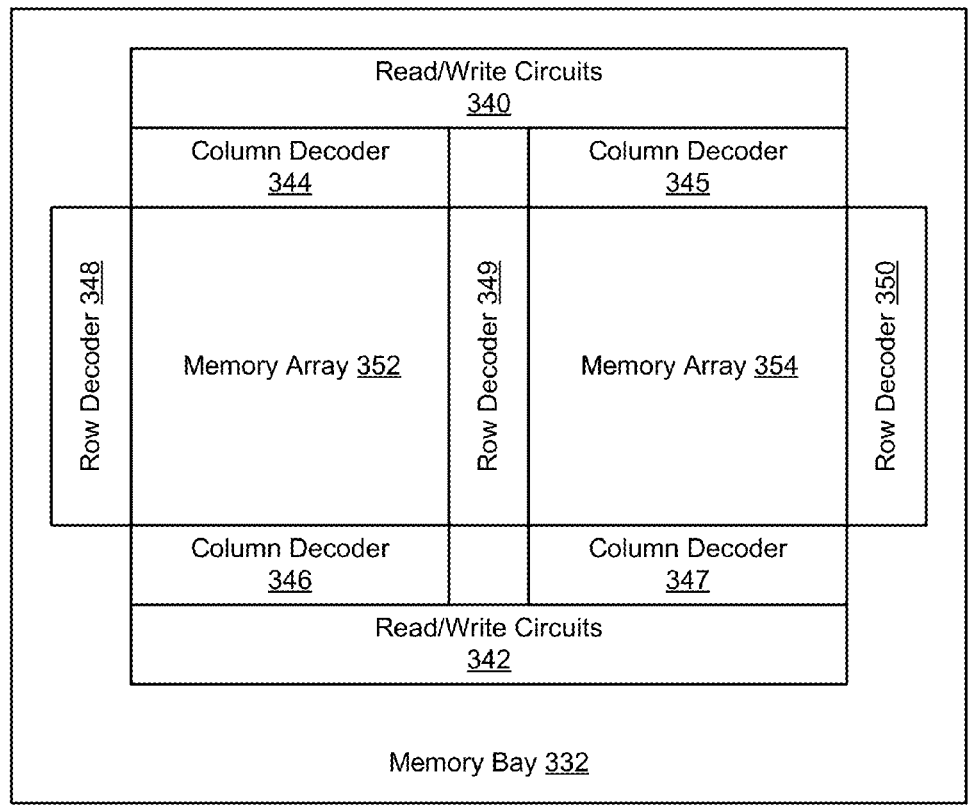
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
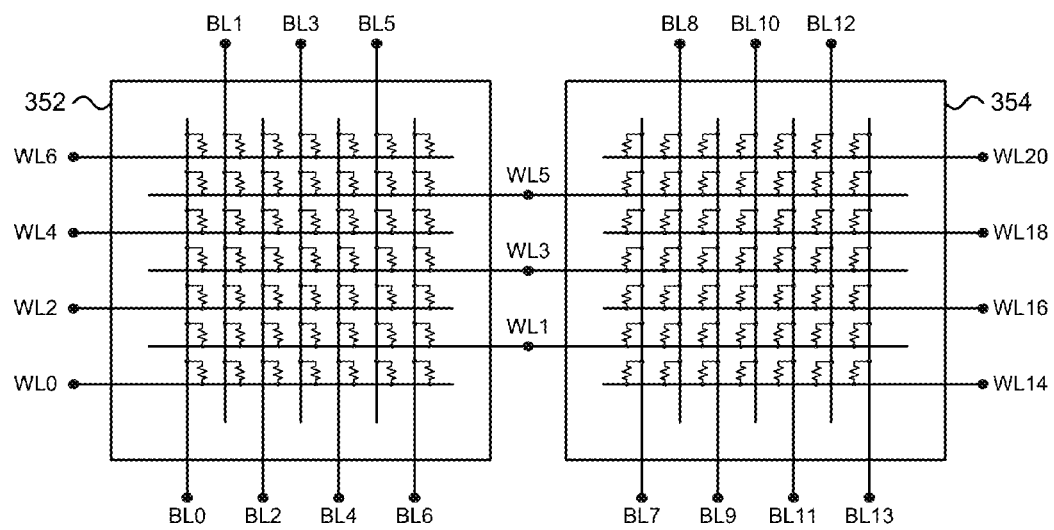
FIG. 2A depicts one embodiment of a schematic diagram corresponding with the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate).

Figure 2B:
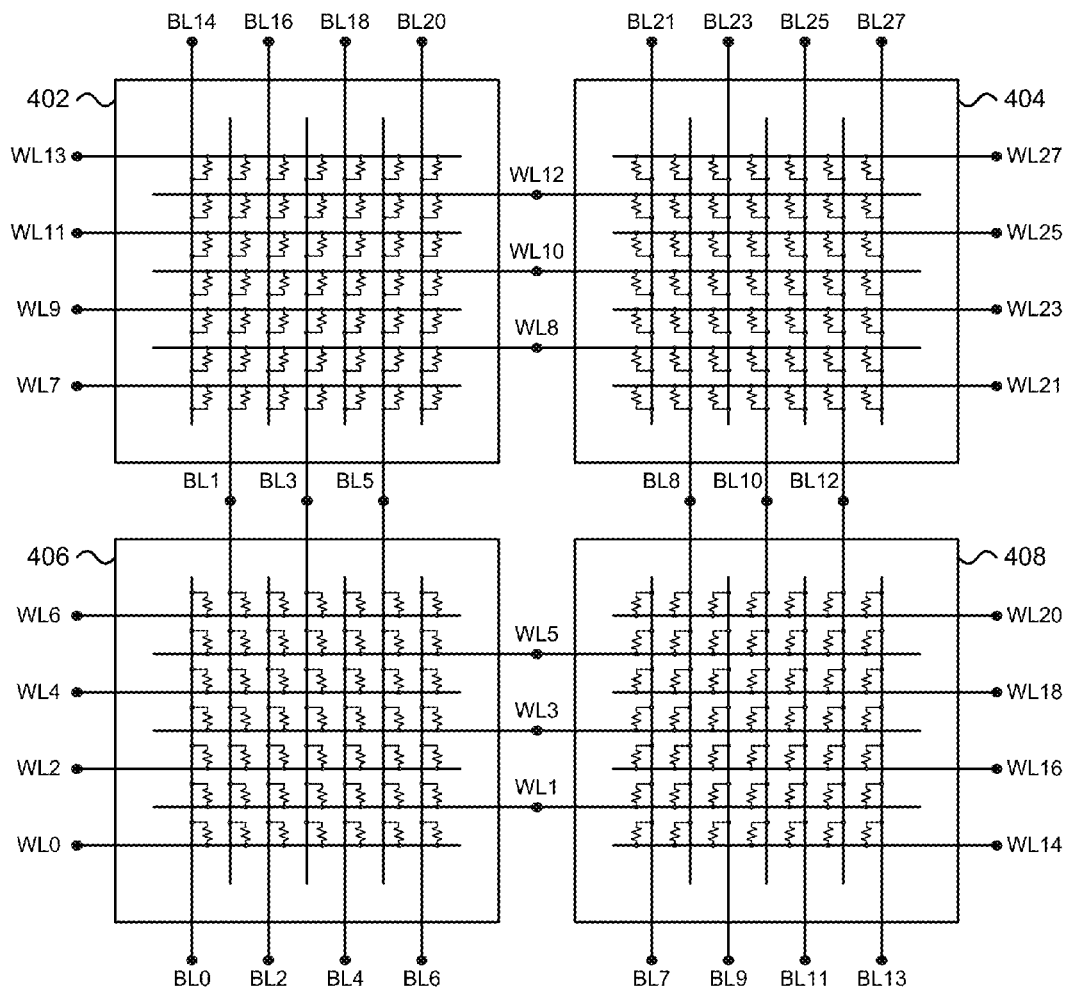
FIG. 2B depicts one embodiment of a schematic diagram corresponding with a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
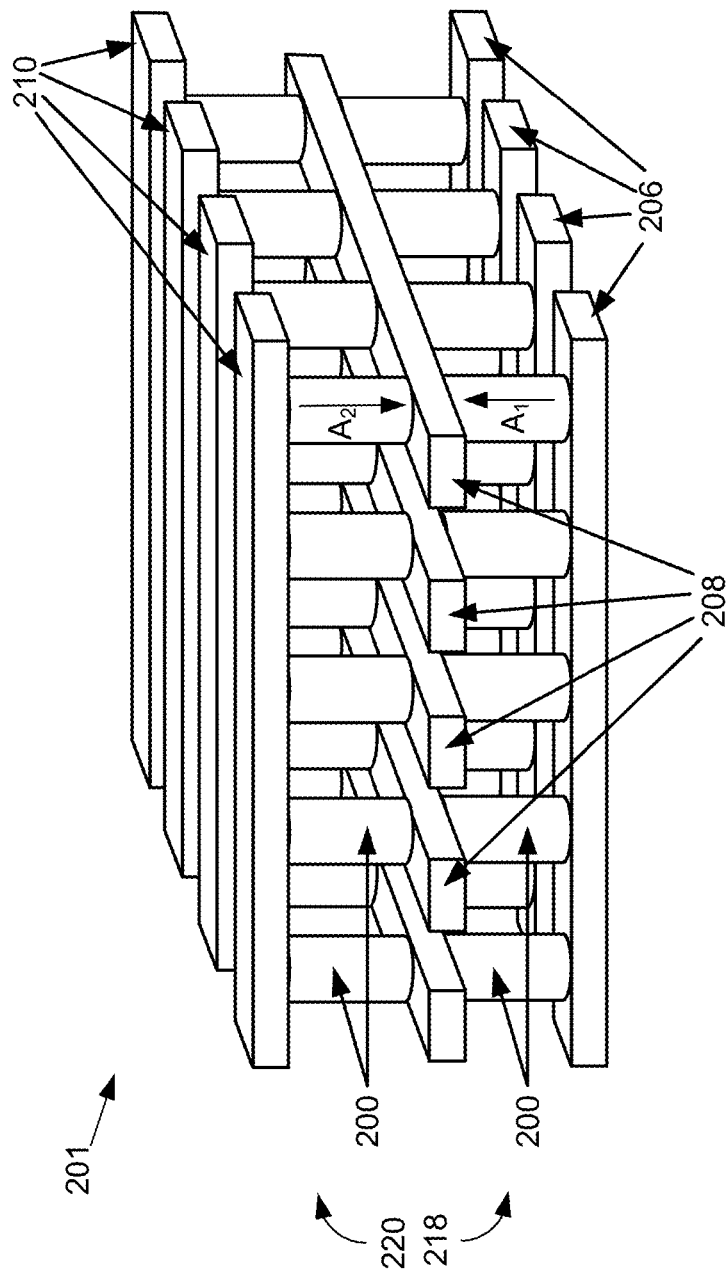
FIG. 3A depicts one embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "0" and the low-resistivity state may be associated with binary data "1." In other embodiments, SETTING and RESETTING operations and/or the data encoding can be reversed. In some embodiments, the first time a resistance-switching element is SET may require a higher than normal programming voltage and may be referred to as a FORMING operation.

More information about non-volatile memories including reversible resistance-switching elements may be found in U.S. Patent Application Publication 2006/0250836, entitled "Rewriteable Memory Cell Comprising a Diode and a Resistance-Switching Material," filed May 9, 2005; U.S. patent application Ser. No. 11/772,084, entitled "Memory Cell That Employs A Selectively Deposited Reversible Resistance Switching Element and Methods of Forming The Same," filed on Jun. 29, 2007; U.S. patent application Ser. No. 12/562,079, entitled "3D Polysilicon Diode With Low Contact Resistance and Method for Forming Same," filed on Sep. 17, 2009; and U.S. patent application Ser. No. 13/029,361, entitled "Structure and Fabrication Method for Resistance-Change Memory Cell in 3-D Memory," filed on Feb. 17, 2011, all of which are herein incorporated by reference in their entirety.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
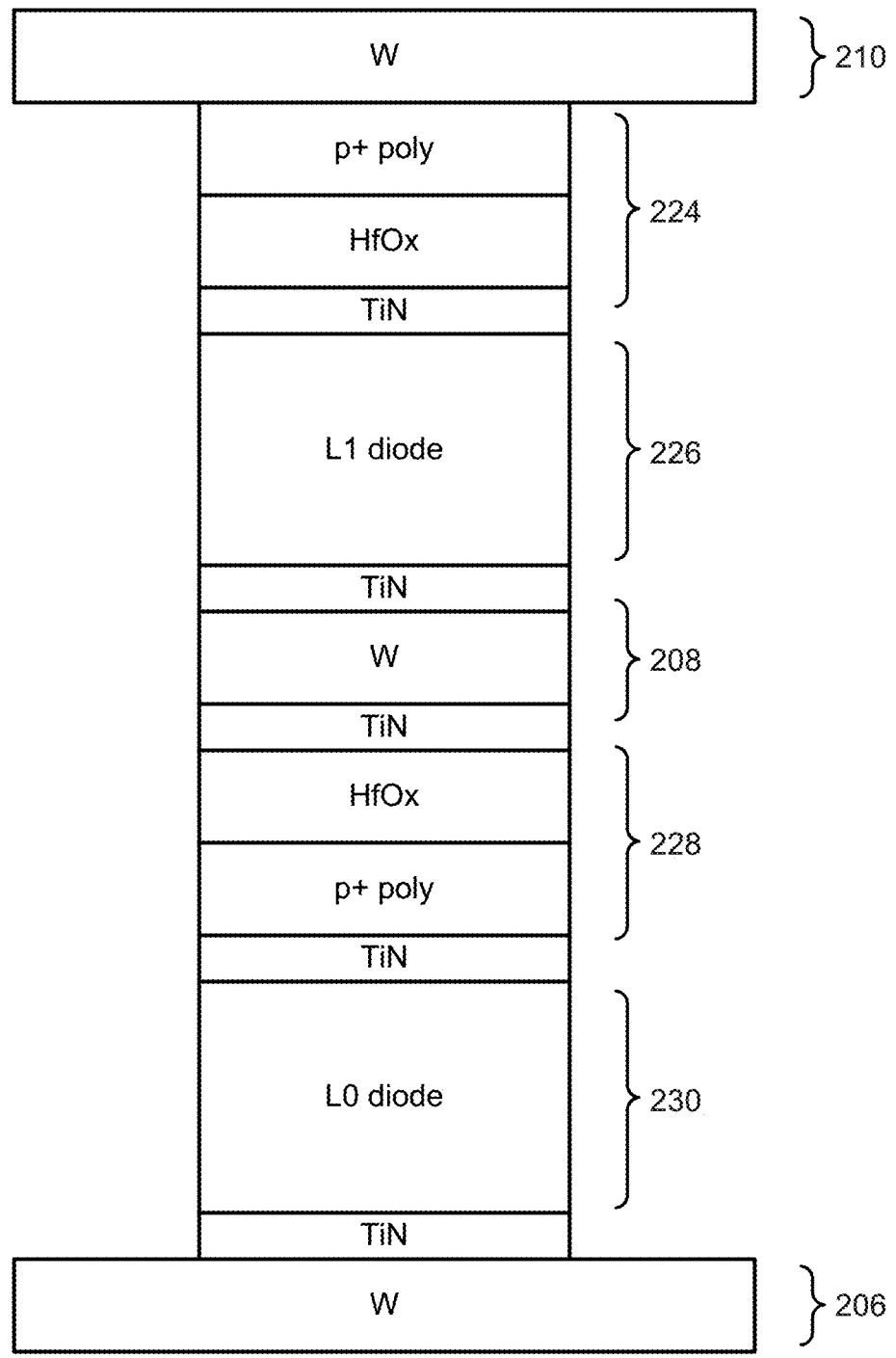
FIG. 3B depicts one embodiment of a portion of a monolithic three-dimensional memory array that includes a second memory level positioned above a first memory level.

FIG. 3B depicts one embodiment of a portion of a monolithic three-dimensional memory array that includes a second memory level positioned above a first memory level. The second memory level includes memory element 224 and steering element 226. The first memory level includes memory element 228 and steering element 230. The bit lines 206 and 210 are arranged in a first direction and the word line 208 is arranged in a second direction perpendicular to the first direction. As depicted, the memory element 224 may include a memory layer stack comprising a layer of p-type polycrystalline silicon (or polysilicon) formed above a layer of hafnium oxide. The steering element 226 may comprise a diode (e.g., a L1 diode) pointing in a first direction. In some cases, the diode may include a heavily doped n+ polysilicon region, a lightly doped or an intrinsic polysilicon region, and a heavily doped p+ polysilicon region. The memory element 228 may include a memory layer stack comprising a layer of hafnium oxide formed above a layer of p-type polysilicon. The steering element 230 may comprise a diode (e.g., a L0 diode) pointing in a second direction different from the first direction. The bit lines 206 and 210 and the word line 208 may comprise a tungsten layer. In some cases, titanium nitride layers may be used as barrier layers (e.g., formed between a memory element and a steering element) or adhesion layers (e.g., formed above a word line layer or a bit line layer).

Figure 3C:
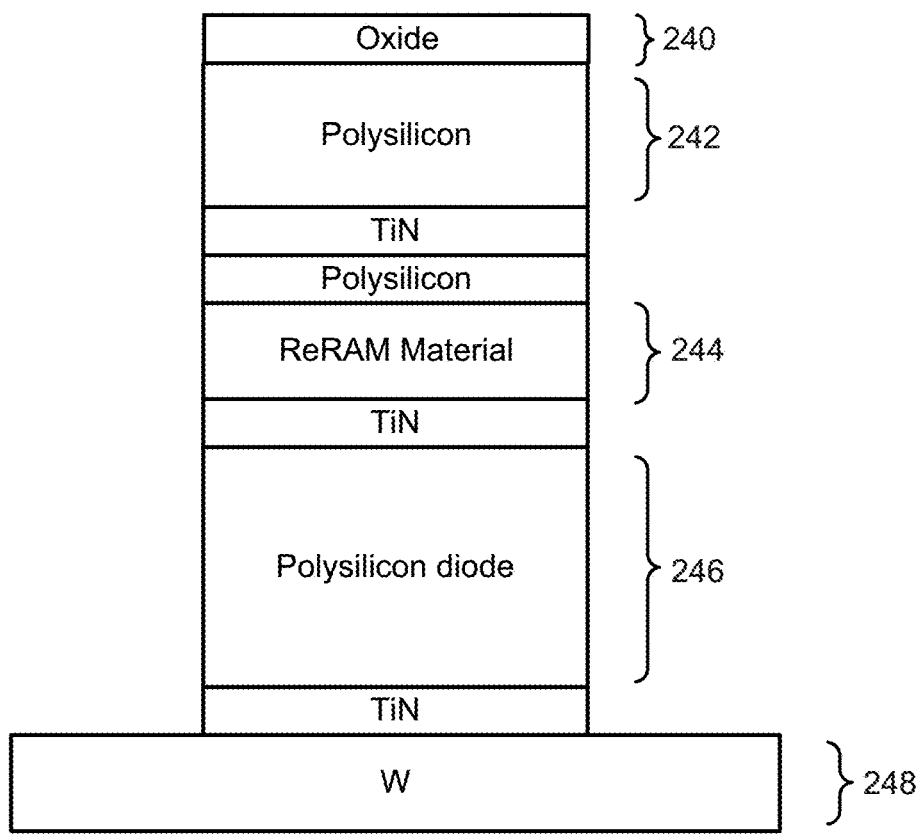
FIG. 3C depicts one embodiment of a portion of a monolithic three-dimensional memory array including a reversible resistance-switching element.

FIG. 3C depicts one embodiment of a portion of a monolithic three-dimensional memory array that includes a first memory level. The first memory level may be connected to a bit line 248. The bit line 248 may comprise a layer of tungsten. The first memory level includes a steering element 246 in series with a reversible resistance-switching element and an embedded resistor 242. The steering element 246 may comprise a polysilicon diode. The reversible resistance-switching element may include a ReRAM material 244. The ReRAM material 244 may comprise a metal oxide layer, such as a layer of nickel oxide or hafnium oxide. The embedded resistor 242 may comprise a layer of polysilicon. When the layer of polysilicon is deposited, the in-situ doping conditions may be selected such that the resulting resistance of the polysilicon layer comprises a first resistance. After the polysilicon layer has been deposited, the polysilicon layer may be doped via ion implantation to reduce the resistance of the polysilicon layer to be less than the first resistance. In some cases, an oxide layer 240 may be formed above the embedded resistor 242. The oxide layer 240 may be used as a capping layer. The doping of the embedded resistor 242 via ion implantation may be performed with or without an oxide layer located above the polysilicon layer. A word line may be formed above the embedded resistor 242. The word line may comprise a layer of tungsten. In some cases, titanium nitride layers may be used as barrier layers (e.g., formed between a memory element and a steering element) or adhesion layers (e.g., formed above a bit line layer).

Figure 3D:
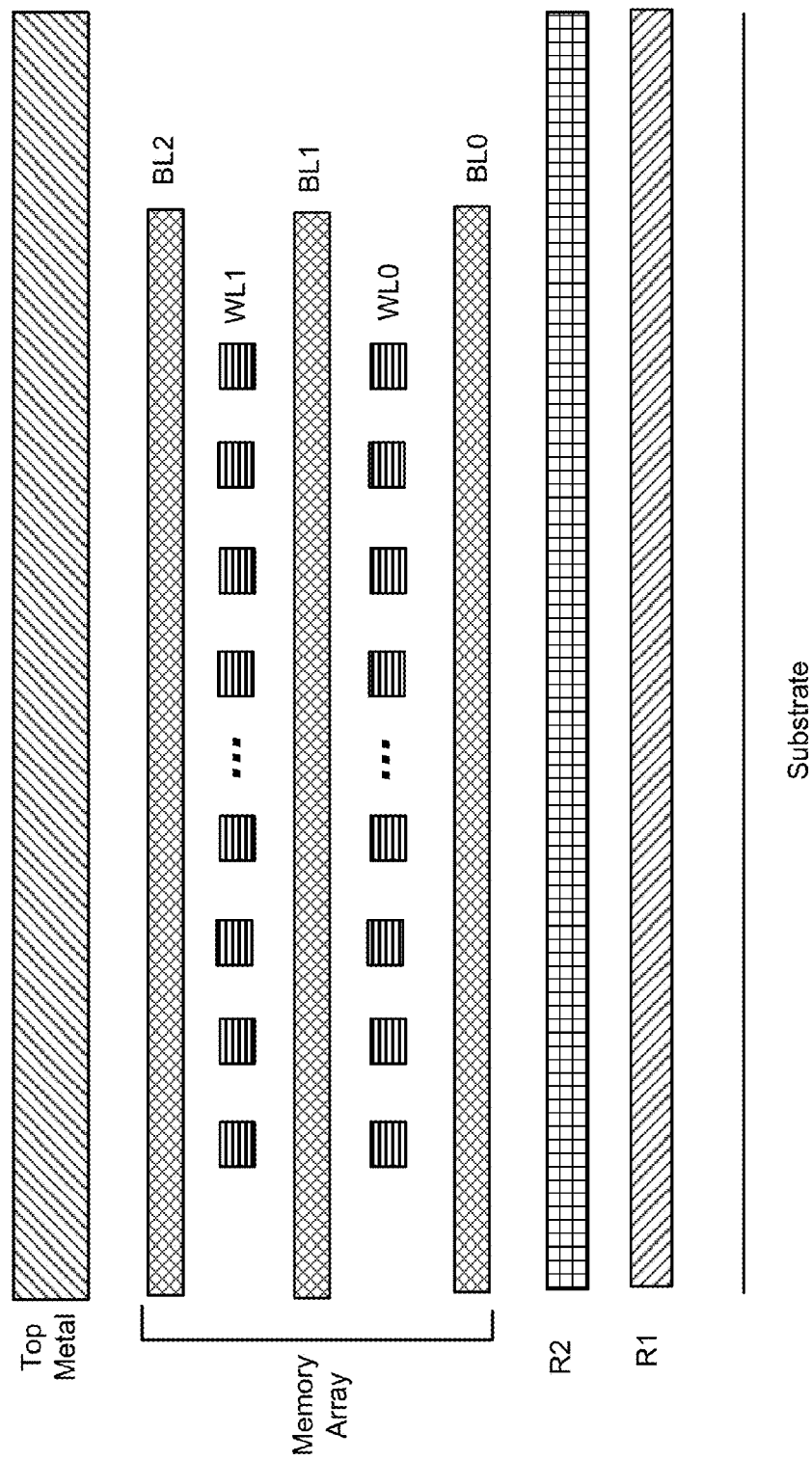
FIG. 3D depicts a subset of the memory array and routing layers of one embodiment of a three-dimensional memory array.

FIG. 3D depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3D, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3E:
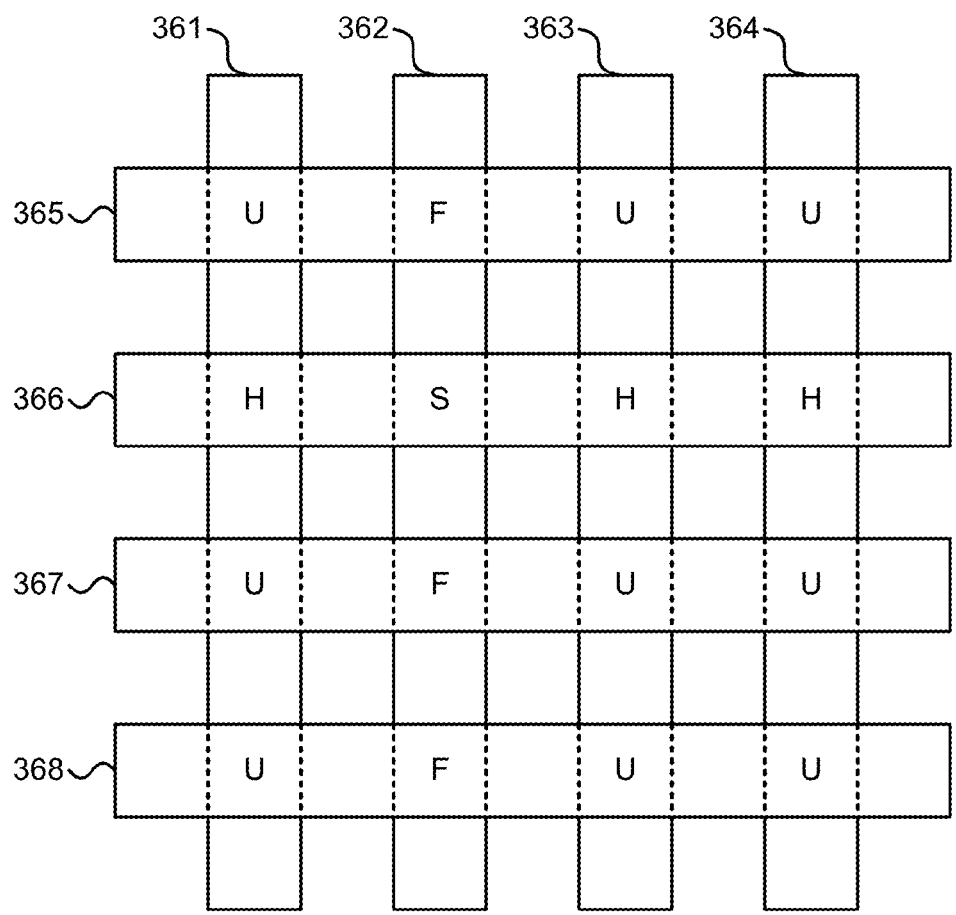
FIGS. 3E-3F depicts various embodiments of a cross-point memory array.

FIG. 3E depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3F:
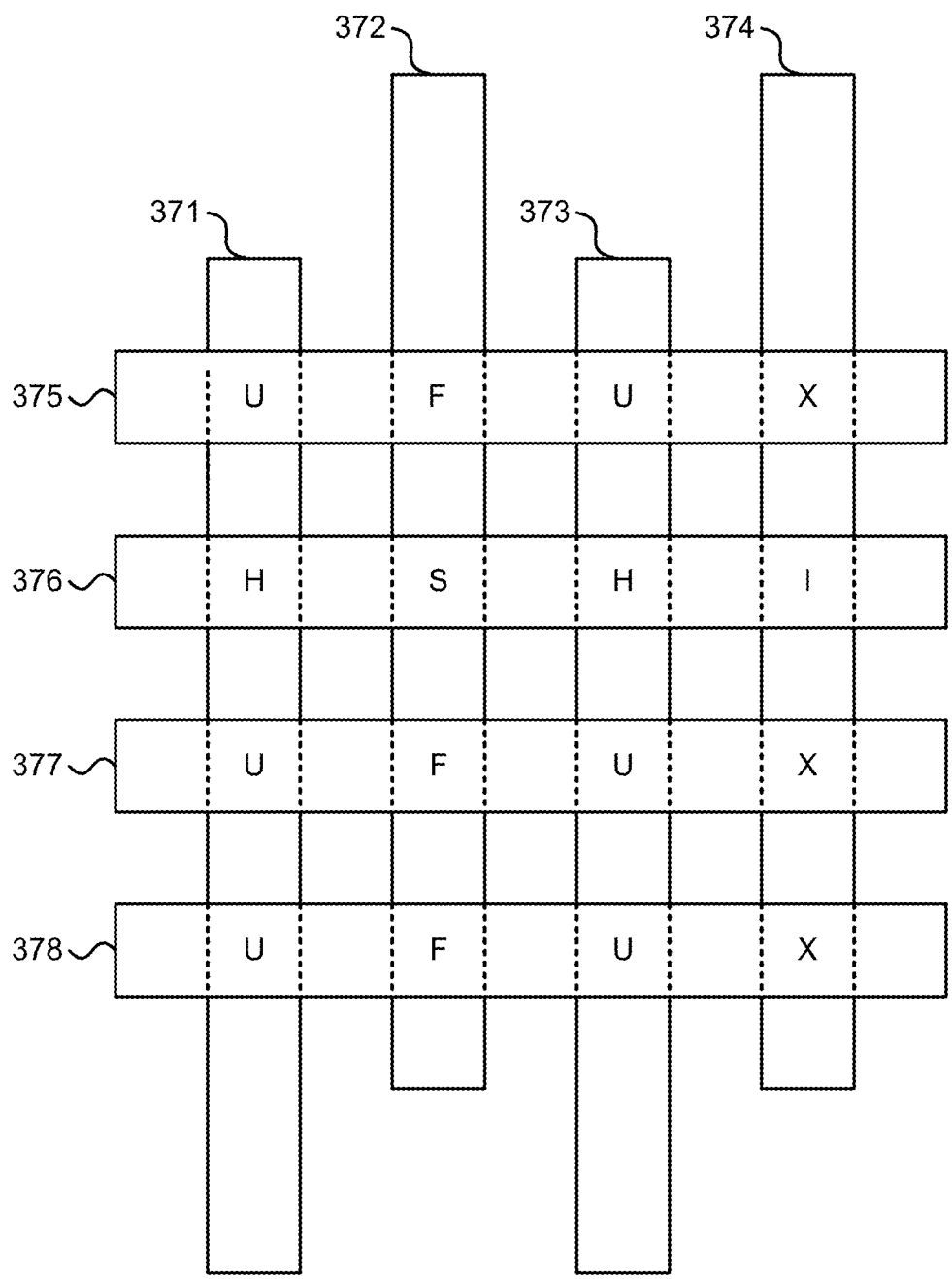

FIG. 3F depicts an alternative embodiment of a cross-point memory array 370. The cross-point memory array 370 may correspond with memory array 201 in FIG. 3A. As depicted, cross-point memory array 370 includes word lines 375-378 and bit lines 371-374. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines. More information regarding vertical bit line three dimensional memory arrays may be found in U.S. Provisional Application 61/526,764, "Optimized Architecture for Three Dimensional Non-Volatile Storage Device with Vertical Bit Lines" and U.S. patent application Ser. No. 13/323,573, "Three Dimensional Non-Volatile Storage with Multi Block Row Selection," all of which are herein incorporated by reference in their entirety.

Figure 4A:
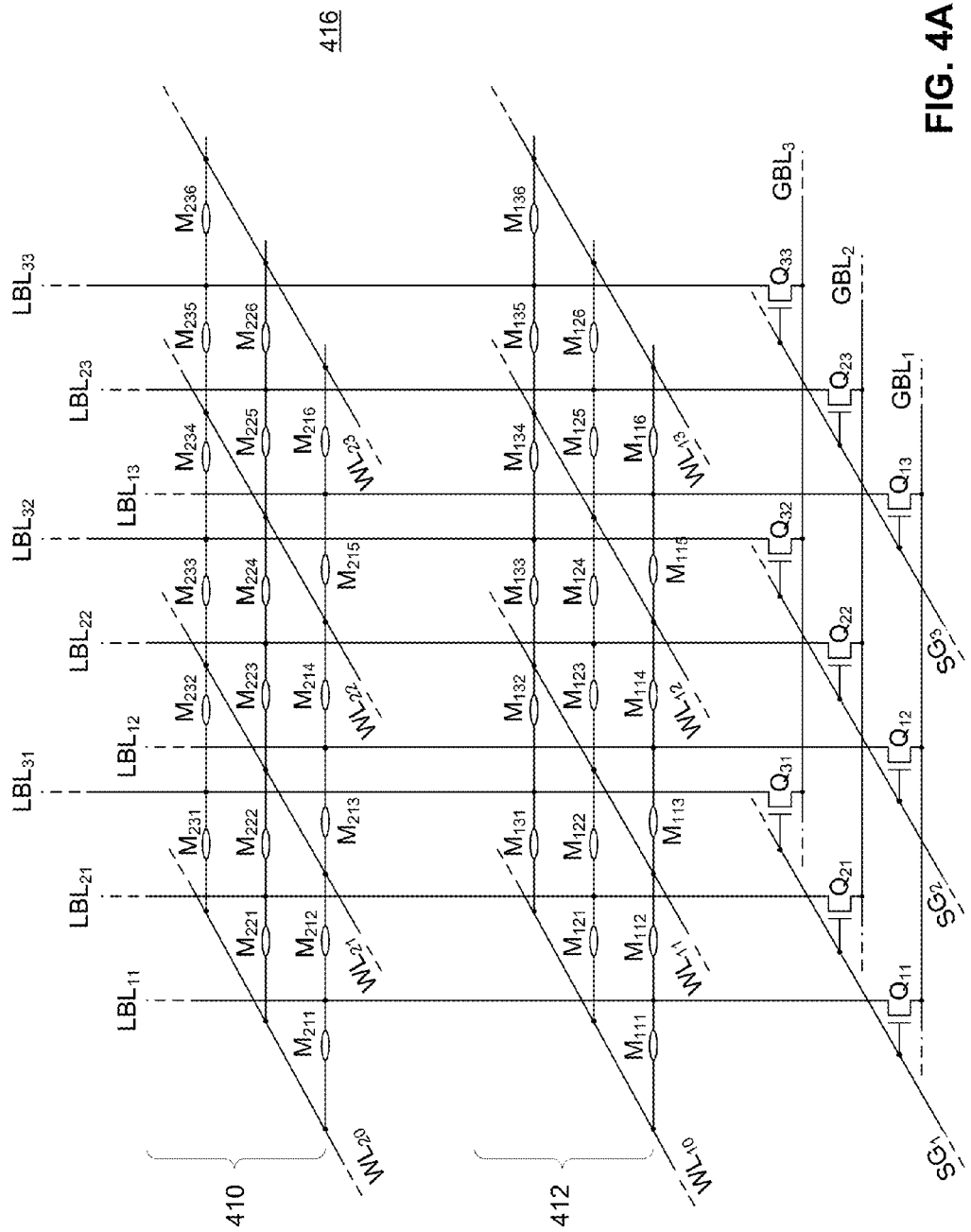
FIG. 4A depicts one embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
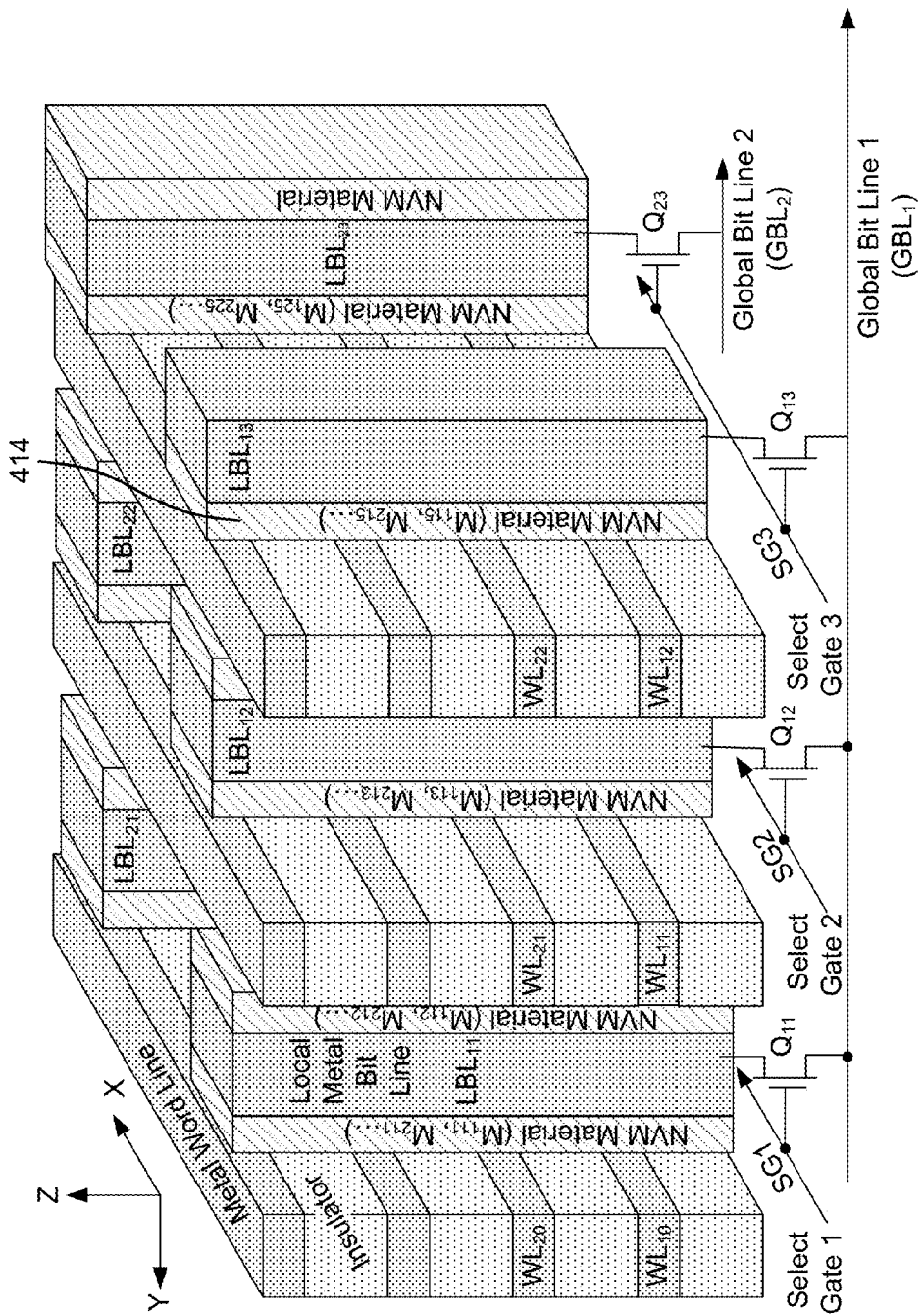
FIG. 4B depicts one embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical TFT.

More information regarding the structure and operation of vertical bit line memory arrays may be found in U.S. Provisional Application 61/423,007, entitled "Non-Volatile Memory Having 3D Array of Read/Write Elements With Vertical Bit Lines and Laterally Aligned Active Elements and Methods Thereof" and U.S. patent application Ser. No. 13/323,703, entitled "Three Dimensional Non-Volatile Storage with Three Device Driver for Row Select," both of which are herein incorporated by reference in their entirety.

Figure 5:
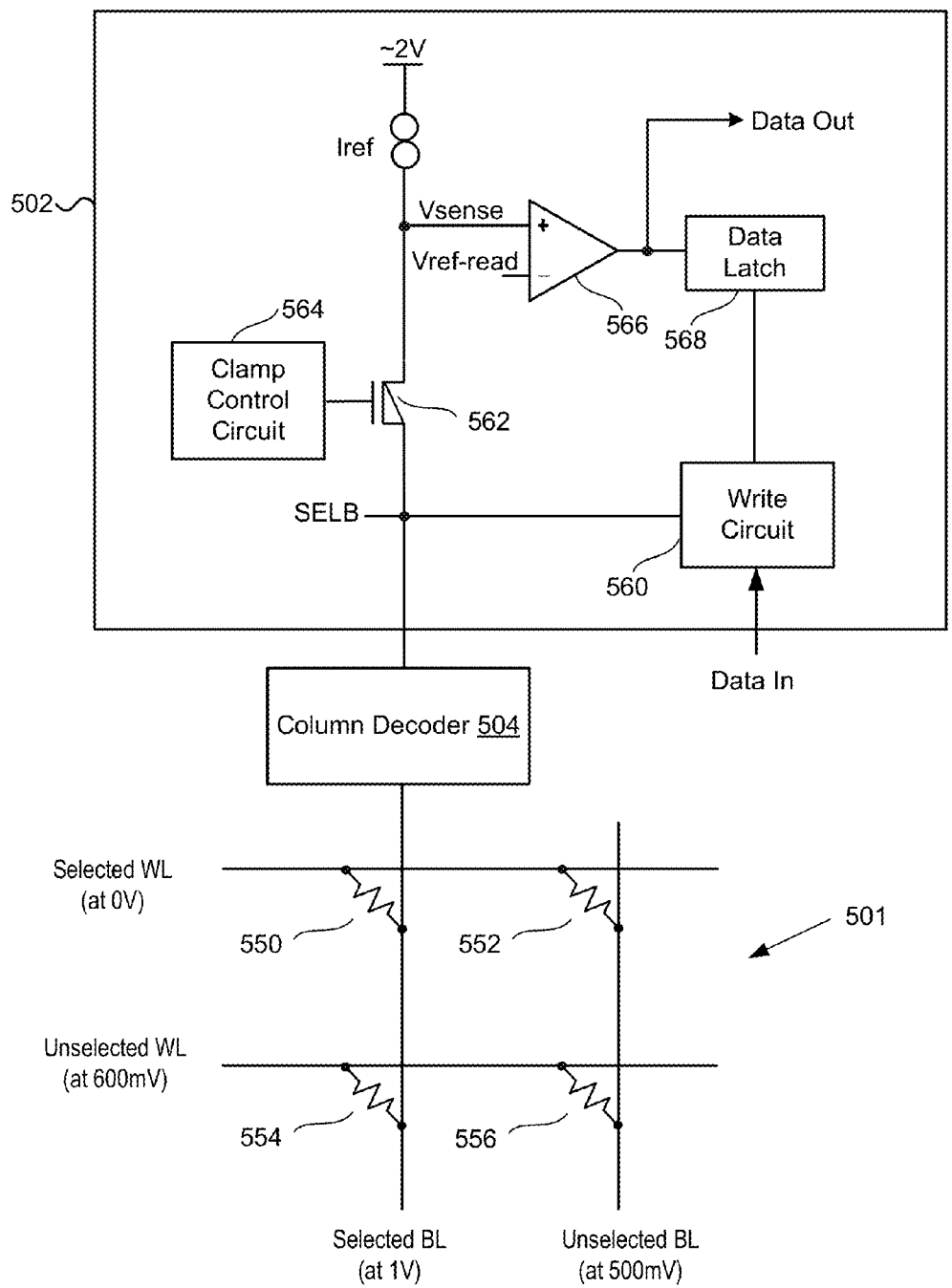
FIG. 5 depicts one embodiment of a read/write circuit along with a portion of a memory array.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 3A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6A:
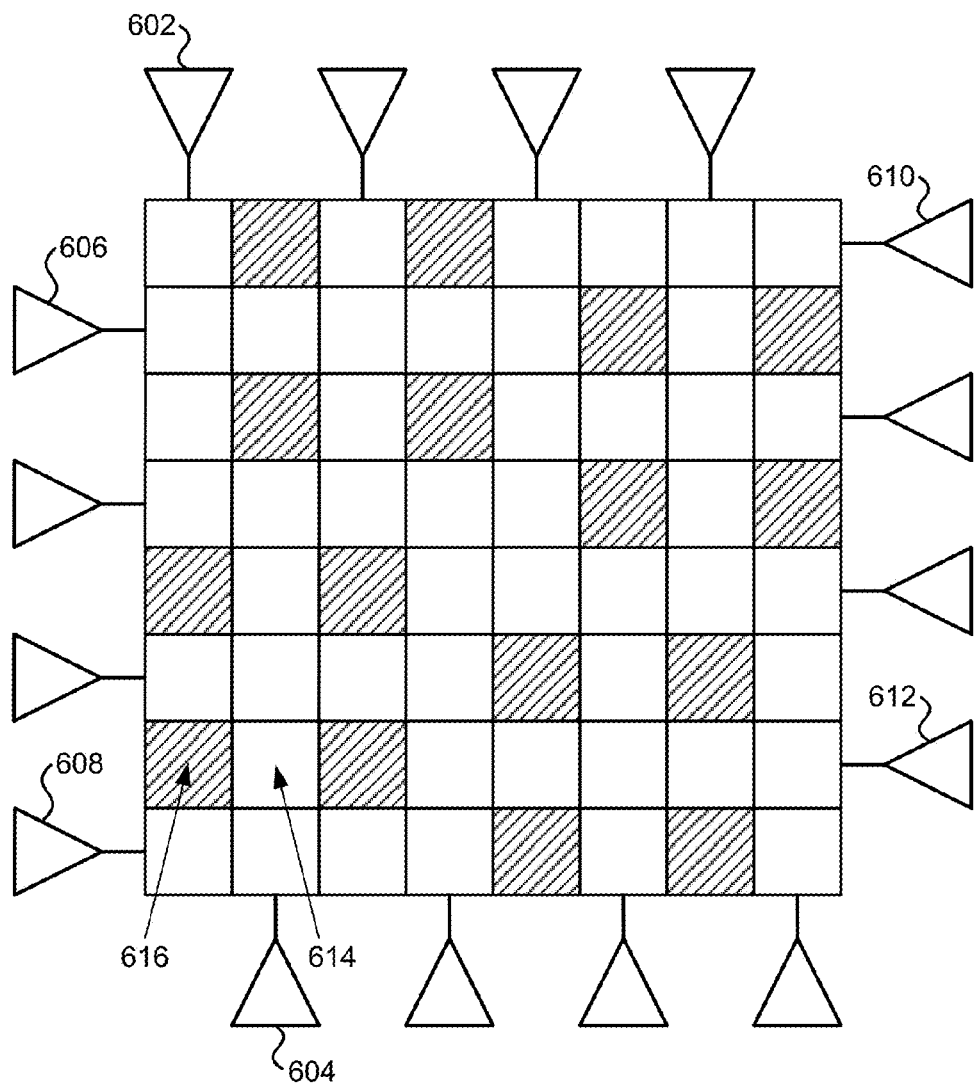
FIG. 6A depicts one embodiment of a memory array including a first region and a second region.

FIG. 6A depicts one embodiment of a memory array including a first region 616 and a second region 614. As depicted, the memory array includes 64 regions arranged in an eight row by eight column grid. Each region of the 64 regions may include one or more memory cells. In one example, each of the regions within the memory array may include 64 memory cells. In this case, word line drivers and bit line drivers may be clustered in groups of eight such that eight adjacent word lines are driven from one side of the memory array (e.g., from the left side of the memory array) by a first set of adjacent word line drivers and eight adjacent bit lines are driven from another side of the memory array (e.g., from the top of the memory array) by a first set of adjacent bit line drivers. The 64 memory cells may be located at or near the intersection of the eight adjacent word lines and the eight adjacent bit lines.

As depicted, the word lines of the memory array may be driven by word line drivers located on a first side (e.g., the left side) of the memory array, such as first set of word line drivers 606 and second set of word line drivers 608, and by word line drivers located on a second side (e.g., the right side) of the memory array, such as third set of word line drivers 610 and fourth set of word line drivers 612. In this case, a first set of eight adjacent word lines may be driven from the second side of the memory array by the third set of word line drivers 610 and a second set of eight adjacent word lines located below the first set of eight adjacent word lines may be driven from the first side of the memory array by the first set of word line drivers 606. The bit lines of the memory array may be driven by bit line drivers located on a third side (e.g., the top side) of the memory array, such as first set of bit line drivers 602, and by bit line drivers located on a fourth side (e.g., the bottom side) of the memory array, such as second set of bit line drivers 604. In this case, a first set of eight adjacent bit lines may be driven from the third side of the memory array by the first set of bit line drivers 602 and a second set of eight adjacent bit lines located next to the first set of eight adjacent bit lines may be driven from the fourth side of the memory array by the second set of bit line drivers 604.

In one embodiment, the first region 616 may include a first memory cell that is connected to a first bit line driven by one of the bit line drivers 602 and a first word line driven by one of the word line drivers 612. In this case, the length of the first bit line spans six regions between the first region 616 and the bit line driver 602 and the length of the first word line spans seven regions between the first region 616 and the word line driver 612. The second region 614 may include a second memory cell that is connected to a second bit line driven by one of the bit line drivers 604 and the first word line driven by one of the word line drivers 612. In this case, the length of the second bit line spans one region between the second region 614 and the bit line driver 604 and the length of the first word line spans six regions between the second region 614 and the word line driver 612. The resistance along a word line may depend on the distance between a memory cell and the word line driver driving the word line connected to the memory cell. The resistance along a bit line may depend on the distance between the memory cell and the bit line driver driving the bit line connected to the memory cell.

As depicted, a first shading (the shading used for the first region 616) is used to indicate those regions of the memory array that are at least four regions from a bit line driver and at least four regions from a word line driver. As the word lines and bit lines must span at least eight regions, the series resistance for memory cells located within the shaded regions may be greater than a threshold. The memory cells located within the shaded regions may be classified as far-far memory cells as the memory cells are located at the far end of a word line and at the far end of a bit line. In one embodiment, dopants may be added to embedded resistors, such as embedded resistor 242 in FIG. 3C, located within those regions of the memory array that are at least four regions from a bit line driver and at least four regions from a word line driver. The dopants may be injected into the embedded resistors using ion implantation. In some cases, as the regions are much larger than the smallest feature size, a non-critical mask may be used to determine the regions of the memory array in which the dopants are added.

Figure 6B:
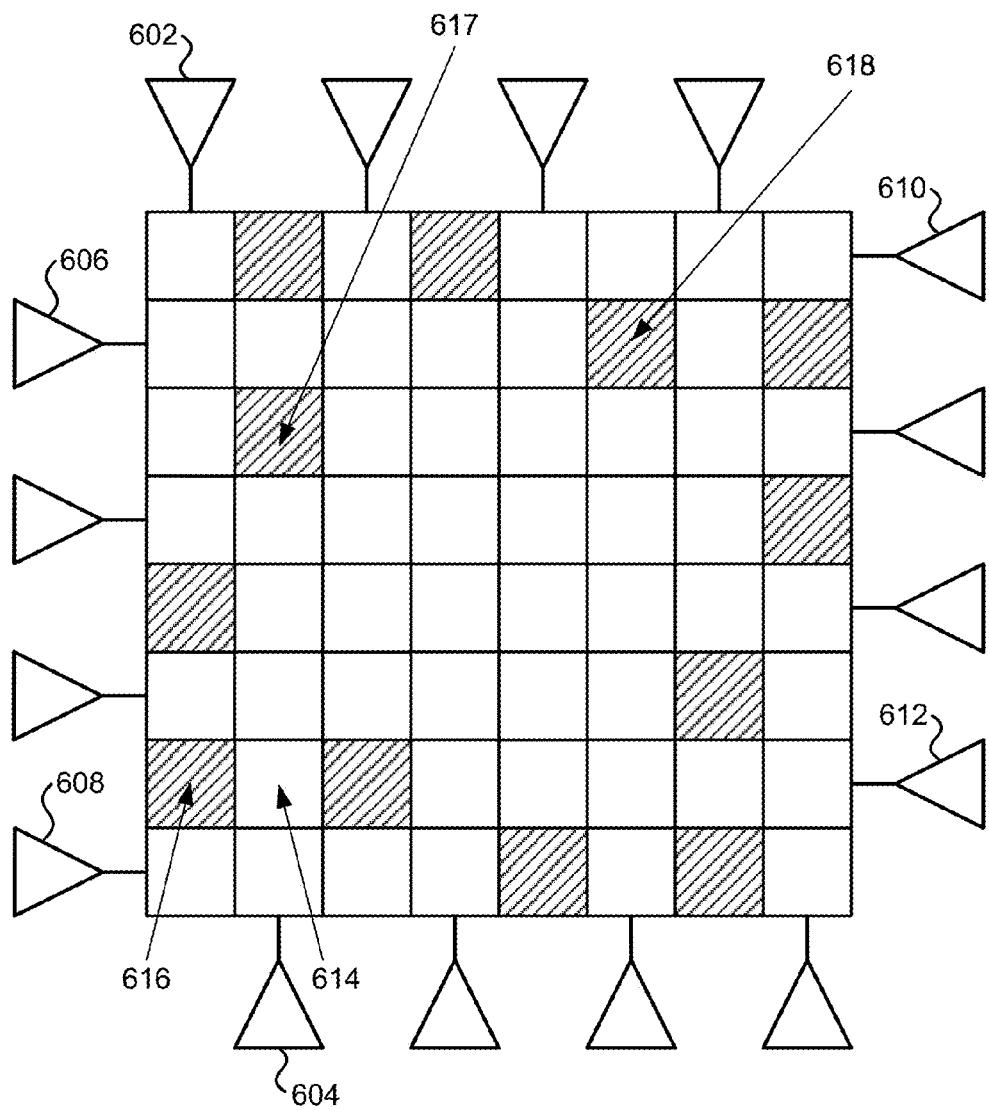
FIG. 6B depicts another embodiment of a memory array including a first region and a second region.

FIG. 6B depicts another embodiment of a memory array including a first region 616 and a second region 614. As depicted, a first shading (the shading used for the first region 616) is used to indicate those regions of the memory array in which word lines and bit lines must travel across at least eleven regions. For example, for the first region 616, the word lines must travel across seven regions from the word line drivers 612 and the bit lines must travel across six regions from the bit line drivers 602. For the shaded region 617, the word lines must travel across six regions from the word line drivers and the bit lines must travel across five regions from the bit line drivers 604. For the shaded region 618, the word lines must travel across five regions from the word line drivers and the bit lines must travel across six regions from the bit line drivers. As the word lines and bit lines must span at least eleven regions, the series resistance for memory cells located within the shaded regions may be greater than a particular threshold. In one embodiment, dopants may be added to embedded resistors, such as embedded resistor 242 in FIG. 3C, located within those regions of the memory array in which word lines and bit lines must travel across at least eleven regions. The dopants may be injected into the embedded resistors using ion implantation. In some cases, as the regions are much larger than the smallest feature size, a non-critical mask may be used to determine the regions of the memory array in which the dopants are added.

Figure 6C:
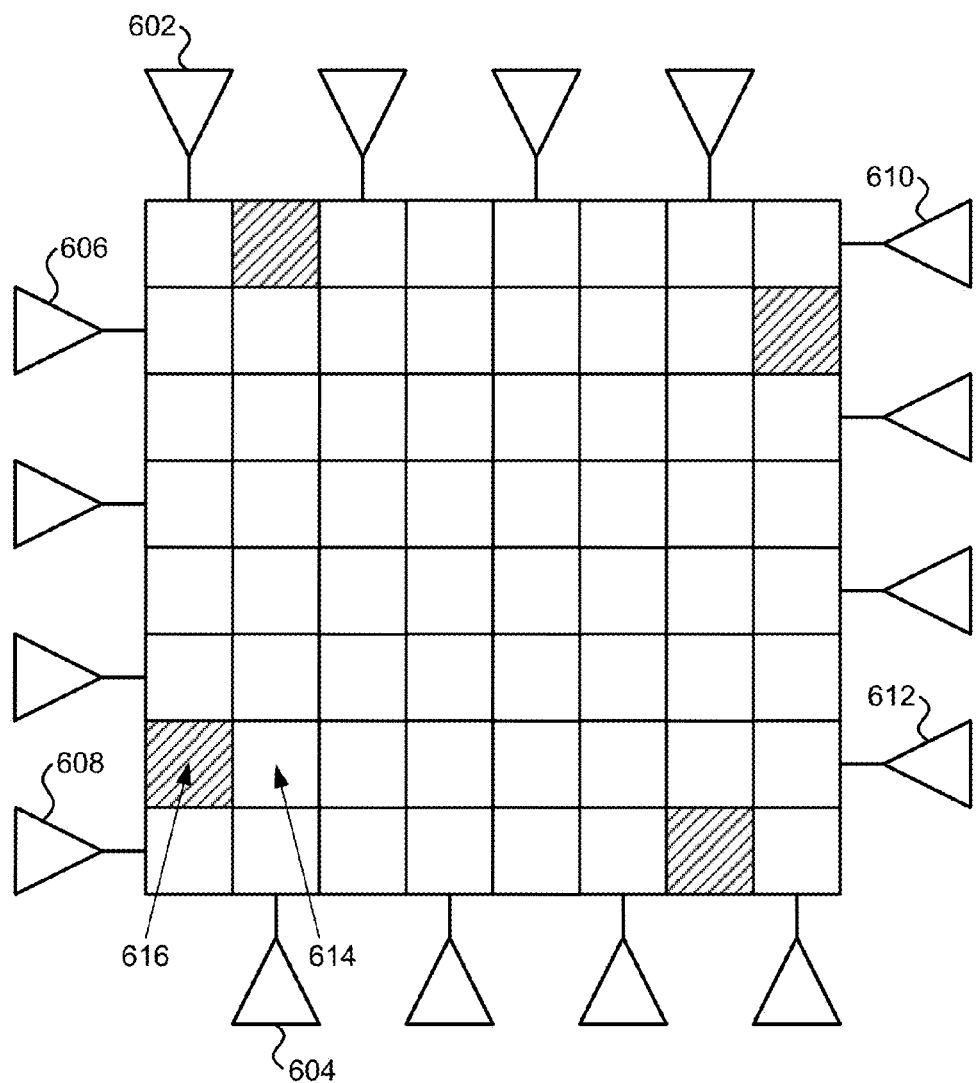
FIG. 6C depicts another embodiment of a memory array including a first region and a second region.

FIG. 6C depicts another embodiment of a memory array including a first region 616 and a second region 614. As depicted, a first shading (the shading used for the first region 616) is used to indicate those regions of the memory array in which word lines and bit lines must travel across at least thirteen regions. For example, for the first region 616, the word lines must travel across seven regions from the word line drivers 612 and the bit lines must travel across six regions from the bit line drivers 602. As the word lines and bit lines must span at least thirteen regions, the series resistance for memory cells located within the shaded regions may be greater than a particular threshold. In one embodiment, dopants may be added to embedded resistors, such as embedded resistor 242 in FIG. 3C, located within those regions of the memory array in which word lines and bit lines must travel across at least thirteen regions. The dopants may be injected into the embedded resistors using ion implantation. In some cases, a mask corresponding with the shaded regions (or the inverse of the shaded regions) may be used to determine the regions of the memory array in which the dopants are added.

Figure 6D:
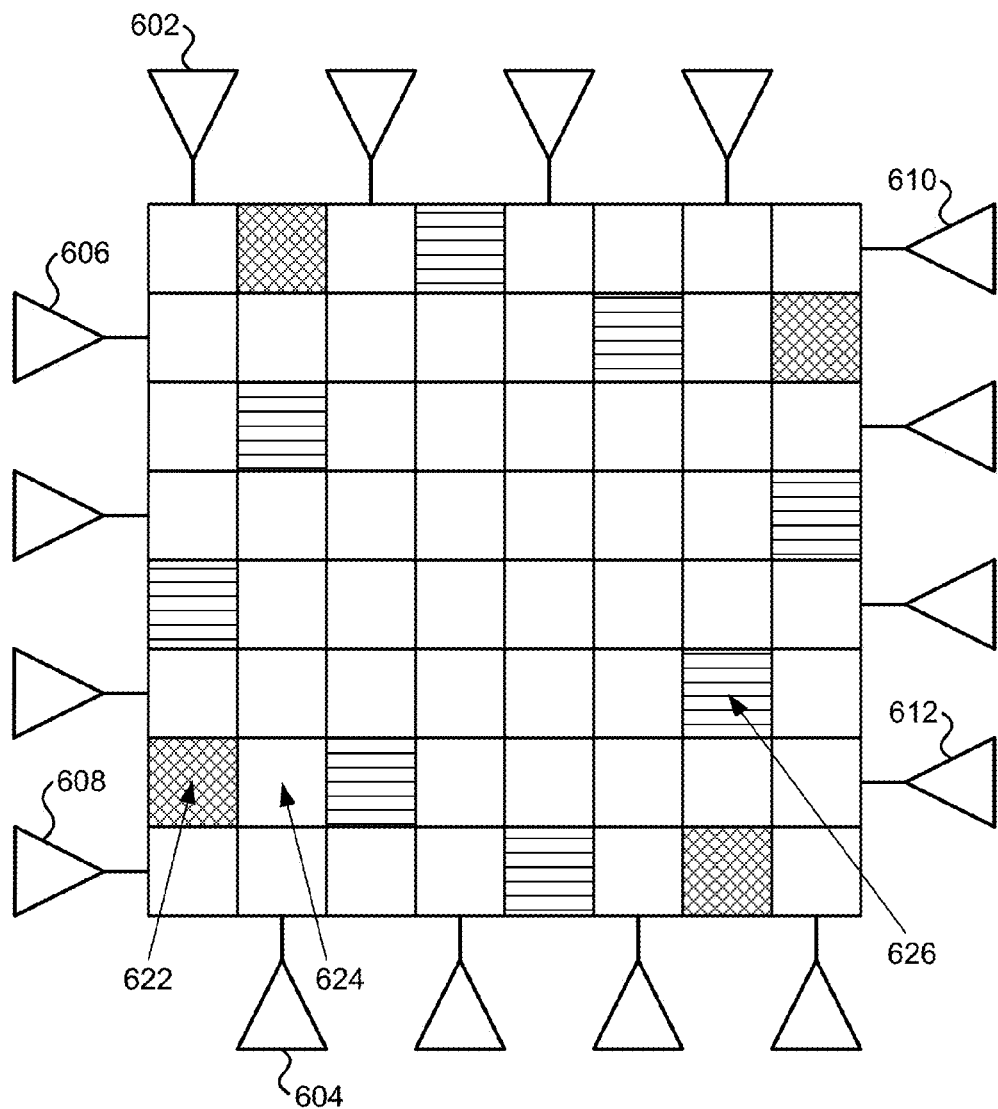
FIG. 6D depicts one embodiment of a memory array including a first region, a second region, and a third region.

FIG. 6D depicts one embodiment of a memory array including a first region 622, a second region 626, and a third region 624. As depicted, a first shading (the shading used for the first region 622) is used to indicate those regions of the memory array in which word lines and bit lines must travel across at least thirteen regions and a second shading (the shading used for the second region 626) is used to indicate those regions of the memory array in which word lines and bit lines must travel across at least eleven regions. For example, for the second region 626, the word lines must travel across six regions from the word line drivers and the bit lines must travel across five regions from the bit line drivers. For the unshaded regions, such as the third region 624, the word lines and bit lines travel across less than eleven regions. For the regions of the memory array in which word lines and bit lines must travel across at least eleven regions, the series resistance for memory cells located within those regions may be greater than a first resistance threshold. For the regions of the memory array in which word lines and bit lines must travel across at least thirteen regions, the series resistance for memory cells located within those regions may be greater than a second resistance threshold that is greater than the first resistance threshold.

In one embodiment, dopants may be added to embedded resistors, such as embedded resistor 242 in FIG. 3C, located within the regions of the memory array in which word lines and bit lines must travel across at least eleven regions during a first doping process (i.e., dopants may be added to regions identified using either the first shading or the second shading). The dopants may be injected into the embedded resistors using ion implantation during the first doping process. In addition to the first doping process a second doping process may be performed in which dopants may be added to embedded resistors located within the regions of the memory array in which word lines and bit lines must travel across at least thirteen regions (i.e., additional dopants may be added to regions identified using only the first shading). The second doping process may be performed prior to or subsequent to the first doping process.

In one example, the embedded resistors for memory cells within the unshaded regions may comprise in-situ doped polysilicon resistors, the embedded resistors for memory cells within the regions shaded with the second shading may comprise in-situ doped and ion implanted polysilicon resistors with a first doping profile and/or a first dose, and the embedded resistors for memory cells within the regions shaded with the first shading may comprise in-situ doped and ion implanted polysilicon resistors with a second doping profile and/or a second dose that is greater than the first dose. Thus, selective ion implantation may allow two or more different sets of embedded resistors to be formed within a memory array.

Figure 7A:
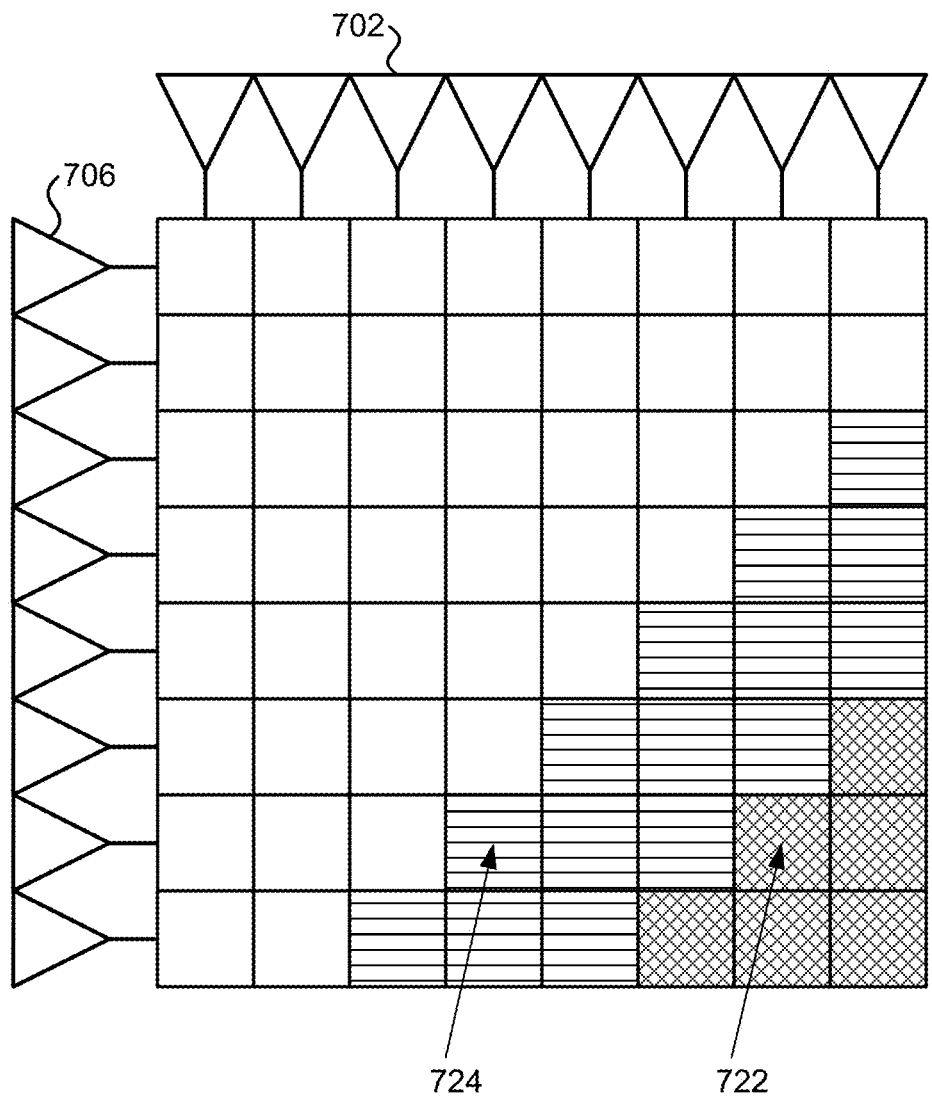
FIG. 7A depicts an alternative embodiment of a memory array including a first region and a second region.

FIG. 7A depicts an alternative embodiment of a memory array including a first region 724 and a second region 722. As depicted, the memory array includes 64 regions arranged in an eight row by eight column grid. Each region of the 64 regions may include one or more memory cells. In one example, each of the regions within the memory array may include 64 memory cells. In this case, word line drivers and bit line drivers may be clustered in groups of eight such that eight adjacent word lines are driven from one side of the memory array (e.g., from the left side of the memory array) by a first set of adjacent word line drivers and eight adjacent bit lines are driven from another side of the memory array (e.g., from the top of the memory array) by a first set of adjacent bit line drivers. The 64 memory cells may be located at or near the intersection of the eight adjacent word lines and the eight adjacent bit lines.

As depicted, the word lines of the memory array may be driven by word line drivers located on a first side (e.g., the left side) of the memory array, such as first set of word line drivers 706. The bit lines of the memory array may be driven by bit line drivers located on a second side (e.g., the top side) of the memory array, such as first set of bit line drivers 702. As depicted, a first shading (the shading used for the first region 724) is used to indicate those regions of the memory array in which word lines and bit lines must travel across at least nine regions. For example, for the first region 724, the word lines must travel across three regions from the word line drivers and the bit lines must travel across six regions from the bit line drivers. As the word lines and bit lines must span at least nine regions, the series resistance for memory cells located within the regions may be greater than a first resistance threshold. A second shading (the shading used for the second region 722) is used to indicate those regions of the memory array in which word lines and bit lines must travel across at least twelve regions. For example, for the second region 722, the word lines must travel across six regions from the word line drivers and the bit lines must travel across six regions from the bit line drivers. As the word lines and bit lines must span at least twelve regions, the series resistance for memory cells located within the regions may be greater than a second resistance threshold that is greater than the first resistance threshold.

In one embodiment, dopants may be added to embedded resistors, such as embedded resistor 242 in FIG. 3C, located within the regions of the memory array in which word lines and bit lines must travel across at least nine regions during a first doping process (i.e., dopants may be added to regions identified using either the first shading or the second shading). The dopants may be injected into the embedded resistors using ion implantation during the first doping process. In addition to the first doping process a second doping process may be performed in which dopants may be added to embedded resistors located within the regions of the memory array in which word lines and bit lines must travel across at least twelve regions (i.e., additional dopants may be added to regions identified using only the first shading). The second doping process may be performed prior to or subsequent to the first doping process. One benefit of the memory array arrangement depicted in FIG. 7A is that fabrication tolerances regarding the outdiffusion of dopants and the alignment of masks may be relaxed.

Figure 7B:
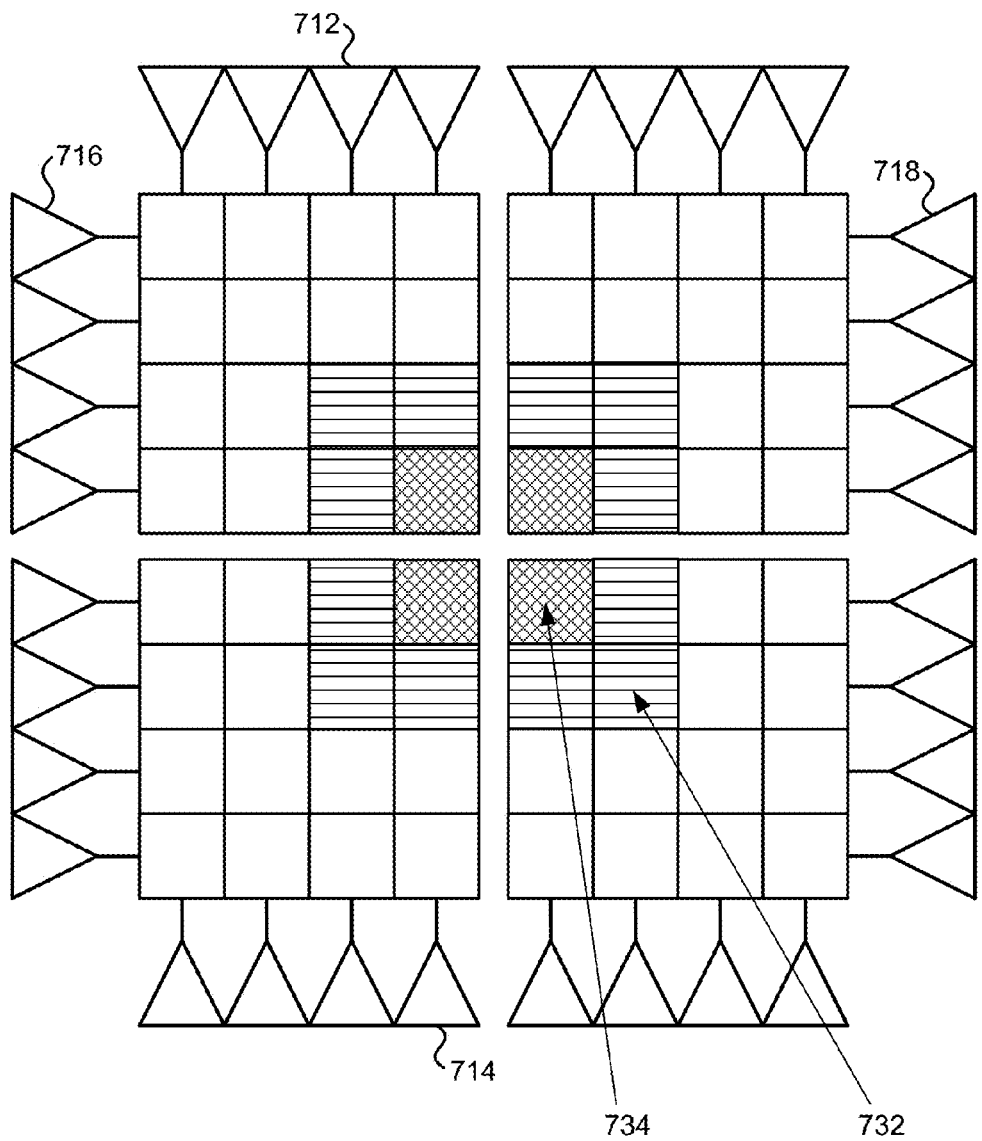
FIG. 7B depicts one embodiment of four memory arrays with word line drivers and bit line drivers arranged around the perimeter of the four memory arrays.

FIG. 7B depicts one embodiment of four memory arrays with word line drivers and bit line drivers arranged around the perimeter of the four memory arrays. The word line drivers include word line drivers 716 and 718. The bit line drivers include bit line drivers 712 and 714. One of the four memory arrays includes a first region 734 and a second region 732. Each region may include one or more memory cells. As depicted, a first shading (the shading used for the first region 734) is used to indicate those regions of the memory array that are at least three regions from a bit line driver and at least three regions from a word line driver. A second shading (the shading used for the second region 732) is used to indicate those regions of the memory array that are at least two regions from a bit line driver and at least two regions from a word line driver. The memory cells located within the shaded regions are located at a word line distance that is more than half of the word line length across the memory array and at a bit line distance that is more than half of the bit line length across the memory array. In one embodiment, a first set of dopants may be added to embedded resistors, such as embedded resistor 242 in FIG. 3C, located within the regions of the memory arrays that are shaded with the first shading and the second shading. The dopants may be injected into the embedded resistors using ion implantation during a first doping process. In addition to the first doping process, a second doping process may be performed in which a second set of dopants may be added to embedded resistors located within the regions of the memory arrays that are only shaded with the first shading. The second doping process may be performed prior to or subsequent to the first doping process. In one example, a first mask may be used to determine a first set of regions across the four memory arrays (e.g., the regions of the memory arrays that are shaded with the first shading and the second shading) in which to perform the first doping process and a second mask may be used to determine a second set of regions across the four memory arrays (e.g., the regions of the memory arrays that are only shaded with the first shading) in which to perform the second doping process.

Figure 8A:
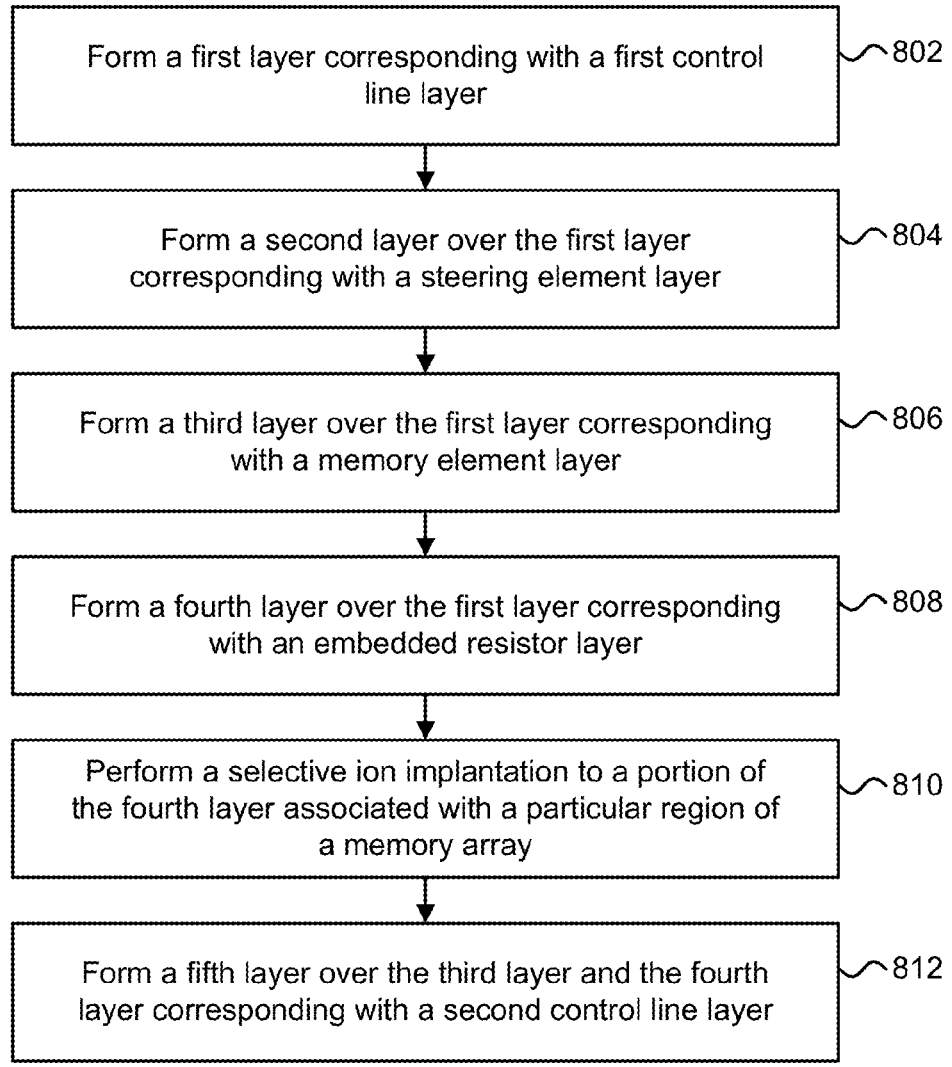
FIG. 8A is a flowchart describing one embodiment of a process for forming two or more different sets of embedded resistors within a memory array.

FIG. 8A is a flowchart describing one embodiment of a process for forming two or more different sets of embedded resistors within a memory array. The flowchart may omit common processing steps (e.g., the formation of isolation regions or structures; various implant and annealing steps; the formation of vias/contacts; common lithography steps including depositing a layer of photoresist (positive or negative) over a material, exposing the layer of photoresist to light via a mask (i.e., the mask determines which areas of the layer of photoresist are exposed to the light), and then selectively etching the material based on the exposed portions of the layer of photoresist; the formation of a passivation layer, planarization, etc.) in order to highlight the processing steps described.

In step 802, a first layer corresponding with a first control line layer is formed. The first layer may comprise a layer of tungsten. The first control line layer may comprise a word line layer or a bit line layer. In step 804, a second layer corresponding with a steering element layer is formed over the first layer. The steering element layer may include a diode. In some cases, the diode may include a heavily doped n+ polysilicon region, a lightly doped or an intrinsic polysilicon region, and a heavily doped p+ polysilicon region. In step 806, a third layer corresponding with a memory element layer is formed over the first layer. In one embodiment, the memory element layer may include a memory layer stack that includes a layer of hafnium oxide or a layer of nickel oxide. In another embodiment, the memory element layer may include a ReRAM material. In step 808, a fourth layer corresponding with an embedded resistor layer is formed over the first layer. The fourth layer may comprise a polysilicon layer. An embedded resistor may comprise a polysilicon resistor. In step 810, a selective ion implantation is performed to a portion of the fourth layer. The portion of the fourth layer may be associated with a particular region of a memory array. The particular region of the memory array may correspond with memory cells that have a series resistance that is greater than a threshold resistance. In step 812, a fifth layer corresponding with a second control line layer is formed over the third layer and the fourth layer. The fifth layer may comprise a layer of tungsten. In one example, if the first control line layer comprises a word line layer, then the second control line layer may comprise a bit line layer. In another example, if the first control line layer comprises a bit line layer, then the second control line layer may comprise a word line layer.

The second layer, third layer, and fourth layer may be formed between the first layer in the fifth layer in any order. The memory element layer may be formed above or below the embedded resistor layer. In one embodiment, the second layer may be formed over the first layer, the third layer may be formed over the second layer, the fourth layer may be formed over the third layer, and the fifth layer may be formed over the fourth layer. In another embodiment, the third layer may be formed over the first layer, a second layer to be formed over the third layer, and the fourth layer may be formed over the second layer. In another embodiment, the fourth layer may be formed over the first layer, the third layer may be formed over the fourth layer, and the fifth layer may be formed over the third layer.

In some embodiments, embedded resistors associated with memory cells with a series resistance above a threshold resistance may be set to a lower resistance than embedded resistors associated with memory cells with a series resistance below the threshold resistance. In one example, when the fourth layer is deposited, the in-situ doping conditions may be selected such that the resulting resistance of the fourth layer allows memory cells with a series resistance below the threshold resistance to be reset. After the fourth layer has been deposited, selective ion implantation may be used to reduce the resistance of a subset of the embedded resistors that are located within a particular region of a memory array. The selective ion implantation may be used to dope portions of the fourth layer within the particular region in order to reduce the resistance of the embedded resistors within the particular region. In this case, the embedded resistors for memory cells within the particular region (e.g., associated with far-far bits) may comprise in-situ doped and selectively ion implanted polysilicon resistors, while the embedded resistors for memory cells outside the particular region may comprise just in-situ doped polysilicon resistors.

Figure 8B:
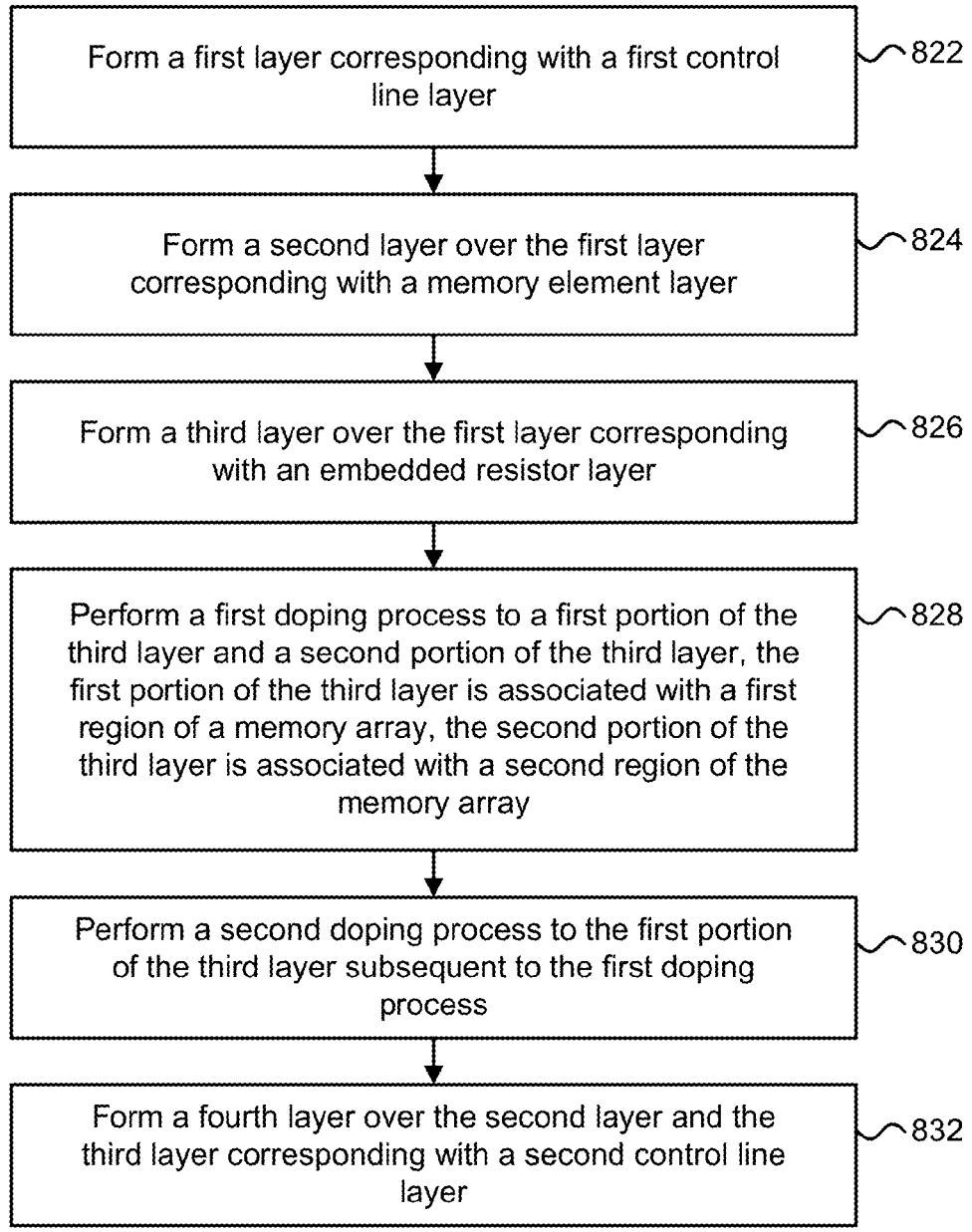
FIG. 8B is a flowchart describing another embodiment of a process for forming two or more different sets of embedded resistors within a memory array.

FIG. 8B is a flowchart describing another embodiment of a process for forming two or more different sets of embedded resistors within a memory array. The flowchart may omit common processing steps (e.g., the formation of isolation regions or structures; various implant and annealing steps; the formation of vias/contacts; common lithography steps including depositing a layer of photoresist (positive or negative) over a material, exposing the layer of photoresist to light via a mask (i.e., the mask determines which areas of the layer of photoresist are exposed to the light), and then selectively etching the material based on the exposed portions of the layer of photoresist; the formation of a passivation layer, planarization, etc.) in order to highlight the processing steps described.

In step 822, a first layer is formed corresponding with a first control line layer. The first layer may be formed above a silicon substrate. The first layer may comprise a layer of tungsten. The first control line layer may comprise a word line layer or a bit line layer. In step 824, a second layer corresponding with a memory element layer is formed over the first layer. In one embodiment, the second layer may comprise a metal oxide, such as nickel oxide. In another embodiment, the memory element layer may include a ReRAM material. In step 826, a third layer corresponding with an embedded resistor layer is formed over the first layer. The third layer may comprise a polysilicon layer. An embedded resistor may comprise a polysilicon resistor. In step 828, a first doping process is performed to a first portion of the third layer and a second portion of the third layer. The first doping process may include an ion implantation process or a diffusion process. The first doping process may add or insert dopants into the first portion and the second portion. The dopants may include arsenic, boron, or phosphorus. The first portion of the third layer may be associated with a first region of the memory array. The second portion of the third layer may be associated with the second region of the memory array. In one example, the first region of the memory array may include memory cells in which the combination of the word line resistance and the bit line resistance is above a first resistance threshold (e.g., above 30K ohms) and the second region of the memory array may include memory cells in which the combination of the word line resistance and the bit line resistance is above a second resistance threshold less than the first resistance threshold (e.g., above 20K ohms). In step 830, a second doping process is performed to the first portion of the third layer. The second doping process may be performed subsequent to the first doping process. The second doping process may be used to further reduce the resistance of embedded resistors within the first region of the memory array relative to the embedded resistors within the second region of the memory array. In step 832, a fourth layer corresponding with a second control line layer is formed over the second layer and the third layer. The fourth layer may comprise a layer of tungsten. In one example, if the first control line layer comprises a word line layer, then the second control line layer may comprise a bit line layer. In another example, if the first control line layer comprises a bit line layer, then the second control line layer may comprise a word line layer.

After the third layer has been deposited, selective ion implantation may be used to reduce the resistance of a subset of the embedded resistors that are located within a particular region of a memory array. The selective ion implantation may be used to dope portions of the third layer within the particular region in order to reduce the resistance of the embedded resistors within the particular region. In this case, the embedded resistors for memory cells within the particular region (e.g., associated with far-near, near-far, or far-far bits) may comprise in-situ doped and selectively ion implanted polysilicon resistors, while the embedded resistors for memory cells outside the particular region may comprise just in-situ doped polysilicon resistors. The ion implanted polysilicon resistors may comprise boron-doped polysilicon resistors or phosphorus-doped polysilicon resistors.

In some embodiments, memory cells in which the combination of the word line resistance and the bit line resistance is above a first resistance threshold may include a first set of embedded resistors with a first resistance (e.g., 4K ohms) and memory cells in which the combination of the word line resistance and the bit line resistance is above a second resistance threshold but less than the first resistance threshold may include a second set of embedded resistors with a second resistance greater than the first resistance (e.g., 8K ohms). In one example, the first set of embedded resistors may comprise in-situ doped and ion implanted polysilicon resistors with a first doping profile and/or a first dopant concentration and the second set of embedded resistors may comprise in-situ doped and ion implanted polysilicon resistors with a second doping profile and/or a second dopant concentration that is less than the first dopant concentration.

One embodiment of the disclosed technology includes forming a first control line layer, forming a memory element layer over the first control line layer, and forming an embedded resistor layer over the first control line layer. The embedded resistor layer includes a first portion associated with a first set of embedded resistors within a first region of a memory array and a second portion associated with a second set of embedded resistors within a second region of the memory array. The method further comprises performing a first doping process to the first portion subsequent to the forming an embedded resistor layer. The performing a first doping process causes the first set of embedded resistors to be less resistive than the second set of embedded resistors. In some cases, the performing a first doping process includes performing a selective ion implantation to the first set of embedded resistors.

One embodiment of the disclosed technology includes a first control line layer, a memory element layer formed above the first control line layer, and an embedded resistor layer formed above the first control line layer. The embedded resistor layer includes a first portion associated with a first set of embedded resistors within a first region of a memory array and a second portion associated with a second set of embedded resistors within a second region of the memory array. The first set of embedded resistors is less resistive than the second set of embedded resistors. In some cases, an oxide layer is formed directly above the embedded resistor layer. The first set of embedded resistors may be made less resistive than the second set of embedded resistors by implanting dopants into the first set of embedded resistors through the oxide layer.

One embodiment of the disclosed technology includes depositing a first control line layer over a substrate, depositing a memory element layer over the first control line layer, and depositing an embedded resistor layer over the first control line layer. The embedded resistor layer includes a first portion associated with a first set of embedded resistors and a second portion associated with a second set of embedded resistors. The first set of embedded resistors are embedded within a first set of memory cells. The second set of embedded resistors are embedded within a second set of memory cells. The first set of memory cells are connected to a first set of word lines and a first set of bit lines. The second set of memory cells are connected to a second set of word lines and a second set of bit lines. The first set of word lines are longer than the second set of word lines. The first set of bit lines are longer than the second set of bit line. The method further comprises adjusting the first set of embedded resistors to be less resistive than the second set of embedded resistors. The adjusting the first set of embedded resistors includes performing a selective ion implantation to the first set of embedded resistors.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to described different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for manufacturing a semiconductor memory, comprising:
   forming a first control line layer;
   forming a memory element layer over the first control line layer;
   forming an embedded resistor layer over the first control line layer, the embedded resistor layer includes a first portion associated with a first set of embedded resistors within a first region of a memory array and a second portion associated with a second set of embedded resistors within a second region of the memory array; and
   performing a first doping process to the first portion subsequent to the forming an embedded resistor layer, the performing a first doping process causes the first set of embedded resistors to be less resistive than the second set of embedded resistors.

2. The method of claim 1, wherein:
   the performing a first doping process includes performing a selective ion implantation to the first set of embedded resistors.

3. The method of claim 2, further comprising:
   forming an oxide layer directly above the embedded resistor layer, the performing a selective ion implantation is performed subsequent to the forming an oxide layer.

4. The method of claim 1, further comprising:
   performing a second doping process to the first portion of the embedded resistor layer and to the second portion of the embedded resistor layer, the embedded resistor layer includes a third portion associated with a third set of embedded resistors within a third region of the memory array, the performing a second doping process causes the first set of embedded resistors to be less resistive than the second set of embedded resistors and the second set of embedded resistors to be less resistive than the third set of embedded resistors.

5. The method of claim 4, wherein:
   the first set of embedded resistors comprises in-situ doped and ion implanted polysilicon resistors with a first doping concentration; and
   the second set of embedded resistors comprises in-situ doped and ion implanted polysilicon resistors with a second doping concentration that is less than the first doping concentration.

6. The method of claim 1, wherein:
   the first region of the memory array includes a first memory cell, the second region of the memory array includes a second memory cell, the performing a first doping process causes the series resistance in series with the first memory cell to be substantially the same as the series resistance in series with the second memory cell.

7. The method of claim 1, wherein:
   the first set of embedded resistors corresponds with memory cells within the first region in which the combination of word line and bit line resistance in series with the memory cells is greater than a resistance threshold; and
   the second set of embedded resistors corresponds with memory cells within the second region in which the combination of word line and bit line resistance in series with the memory cells is less than the resistance threshold.

8. The method of claim 1, wherein:
   the first set of embedded resistors is associated with far-far bits within the memory array.

9. The method of claim 1, further comprising:
   forming a second control line layer over the embedded resistor layer; and
   forming a steering element layer between the first control line layer and the second control line layer.

10. The method of claim 1, wherein:
    the first set of embedded resistors comprises polysilicon resistors with a first resistance; and
    the second set of embedded resistors comprises polysilicon resistors with a second resistance greater than the first resistance.

11. The method of claim 1, wherein:
    the first region of the memory array is adjacent to the second region of the memory array.

12. The method of claim 1, wherein:
    the first region of the memory array includes a first plurality of memory cells that is connected to a first word line and a second plurality of memory cells that is connected to a second word line; and
    the second region of the memory array includes a third plurality of memory cells that is connected to the first word line and a fourth plurality of memory cells that is connected to the second word line.

13. The method of claim 1, wherein:
    the first control line layer comprises a word line layer;
    the memory element layer includes a ReRAM material; and
    the embedded resistor layer comprises a layer of polysilicon.

14. The method of claim 1, wherein:
    the memory array is part of a non-volatile storage system, the memory array comprises a non-volatile memory that is monolithically formed in one or more physical levels of memory cells having active areas disposed above a silicon substrate, the non-volatile storage system includes circuitry associated with the operation of the memory array.

15. The method of claim 1, wherein:
    the memory array comprises a three-dimensional memory array.

16. A method for manufacturing a semiconductor memory, comprising:

depositing a first control line layer over a substrate;

depositing a memory element layer over the first control line layer;

depositing an embedded resistor layer over the first control line layer, the embedded resistor layer includes a first portion associated with a first set of embedded resistors and a second portion associated with a second set of embedded resistors, the first set of embedded resistors are embedded within a first set of memory cells, the second set of embedded resistors are embedded within a second set of memory cells, the first set of memory cells are connected to a first set of word lines and a first set of bit lines, the second set of memory cells are connected to a second set of word lines and a second set of bit lines, the first set of word lines are longer than the second set of word lines, the first set of bit lines are longer than the second set of bit line; and adjusting the first set of embedded resistors to be less resistive than the second set of embedded resistors, the adjusting the first set of embedded resistors includes performing a selective ion implantation to the first set of embedded resistors.

\* \* \* \* \*